US012559853B2

(12) United States Patent
Banik, II et al.

(10) Patent No.: US 12,559,853 B2
(45) Date of Patent: Feb. 24, 2026

(54) DIFFERENTIAL CONTRAST PLATING FOR ADVANCED PACKAGING APPLICATIONS

(71) Applicant: Lam Research Corporation, Fremont, CA (US)

(72) Inventors: Stephen J. Banik, II, Philadelphia, PA (US); Jacob Kurtis Blickensderfer, Portland, OR (US); Kailash Venkatraman, Portland, OR (US); Justin Oberst, Beaverton, OR (US); Lee Peng Chua, Beaverton, OR (US); Bryan L. Buckalew, Tualatin, OR (US); Steven T. Mayer, Aurora, OR (US)

(73) Assignee: Lam Research Corporation, Fremont, CA (US)

( * ) Notice: Subject to any disclaimer, the term of this patent is extended or adjusted under 35 U.S.C. 154(b) by 422 days.

(21) Appl. No.: 17/597,775

(22) PCT Filed: Jul. 22, 2020

(86) PCT No.: PCT/US2020/070303
§ 371 (c)(1),
(2) Date: Jan. 21, 2022

(87) PCT Pub. No.: WO2021/022292
PCT Pub. Date: Feb. 4, 2021

(65) Prior Publication Data
US 2022/0275531 A1      Sep. 1, 2022

Related U.S. Application Data

(60) Provisional application No. 62/879,277, filed on Jul. 26, 2019.

(51) Int. Cl.
C25D 5/02 (2006.01)
C25D 3/38 (2006.01)
(Continued)

(52) U.S. Cl.
CPC .............. C25D 7/123 (2013.01); C25D 3/38 (2013.01); C25D 5/022 (2013.01); H01L 24/11 (2013.01);
(Continued)

(58) Field of Classification Search
None
See application file for complete search history.

(56) References Cited

U.S. PATENT DOCUMENTS

| | | | |
|---|---|---|---|
| 3,362,851 A | 1/1968 | Thomas et al. | |
| 4,216,272 A | 8/1980 | Clauss | |

(Continued)

FOREIGN PATENT DOCUMENTS

| | | |
|---|---|---|
| CN | 101004401 A | 7/2007 |
| EP | 1505638 A2 | 2/2005 |

(Continued)

OTHER PUBLICATIONS

WO2013090295 (Year: 2013).*
(Continued)

*Primary Examiner* — Stefanie S Wittenberg
(74) *Attorney, Agent, or Firm* — Weaver Austin Villeneuve & Sampson LLP

(57) ABSTRACT

A method of electroplating a metal into features, having substantially different depths, of a partially fabricated electronic device on a substrate is provided. The method includes adsorbing accelerator into the bottom of recessed features; partially filling the features by a bottom up fill mechanism in an electroplating solution; diffusing leveler into shallow features to decrease the plating rate in shallow features as compared to deep features; and electroplating more metal into the features such that the height of metal in deep features is similar to the height of metal in shallow features.

36 Claims, 13 Drawing Sheets

340          350

360

(51) Int. Cl.
  *C25D 7/12*      (2006.01)
  *H01L 23/00*     (2006.01)
  *C25D 17/00*     (2006.01)

(52) U.S. Cl.
  CPC ............. *H01L 24/13* (2013.01); *H01L 24/14* (2013.01); *C25D 17/001* (2013.01); *H01L 24/742* (2013.01); *H01L 2224/11462* (2013.01); *H01L 2224/117* (2013.01); *H01L 2224/11831* (2013.01); *H01L 2224/1184* (2013.01); *H01L 2224/11845* (2013.01); *H01L 2224/11901* (2013.01); *H01L 2224/13005* (2013.01); *H01L 2224/13147* (2013.01); *H01L 2224/1357* (2013.01); *H01L 2224/13647* (2013.01); *H01L 2224/1403* (2013.01)

(56)           References Cited

U.S. PATENT DOCUMENTS

| | | | |
|---|---|---|---|
| 4,301,196 A | 11/1981 | McCormack et al. | |
| 4,519,878 A | 5/1985 | Hara et al. | |
| 5,051,154 A | 9/1991 | Bernards et al. | |
| 5,100,714 A | 3/1992 | Zsamboky | |
| 5,252,196 A * | 10/1993 | Sonnenberg ............. | C25D 3/38 |
| | | | 205/125 |
| 5,328,589 A | 7/1994 | Martin | |
| 5,549,808 A | 8/1996 | Farooq et al. | |
| 5,985,106 A | 11/1999 | Velasquez | |
| 6,126,798 A | 10/2000 | Reid et al. | |
| 6,156,167 A | 12/2000 | Patton et al. | |
| 6,193,858 B1 | 2/2001 | Hradil et al. | |
| 6,569,299 B1 | 5/2003 | Reid et al. | |
| 6,652,731 B2 | 11/2003 | Cobley et al. | |
| 6,800,187 B1 | 10/2004 | Reid et al. | |
| 6,884,332 B2 | 4/2005 | Forth et al. | |
| 7,064,068 B2 | 6/2006 | Chou et al. | |
| 7,189,647 B2 | 3/2007 | Patton et al. | |
| 7,449,098 B1 | 11/2008 | Mayer et al. | |
| 8,003,527 B2 | 8/2011 | Sunayama et al. | |
| 8,197,662 B1 * | 6/2012 | Webb .................. | H01L 21/2885 |
| | | | 205/210 |
| 8,481,418 B2 * | 7/2013 | Lee .......................... | H01L 24/15 |
| | | | 257/E21.508 |
| 8,808,521 B2 | 8/2014 | Zhou | |
| 8,962,085 B2 | 2/2015 | Mayer et al. | |
| 9,257,401 B2 | 2/2016 | Hsu et al. | |
| 9,309,604 B2 | 4/2016 | Mayer et al. | |
| 9,309,605 B2 | 4/2016 | Mayer | |
| 9,455,139 B2 | 9/2016 | Buckalew et al. | |
| 9,523,155 B2 | 12/2016 | Mayer et al. | |
| 9,856,574 B2 | 1/2018 | Mayer | |
| 9,870,995 B2 | 1/2018 | Nian et al. | |
| 10,094,034 B2 | 10/2018 | Graham et al. | |
| 10,094,035 B1 | 10/2018 | Graham et al. | |
| 10,233,556 B2 | 3/2019 | Graham et al. | |
| 10,364,505 B2 | 7/2019 | Thorkelsson et al. | |
| 10,692,735 B2 | 6/2020 | Thorkelsson et al. | |
| 12,305,307 B2 | 5/2025 | Shin et al. | |
| 2001/0014409 A1 | 8/2001 | Cohen | |
| 2001/0015321 A1 * | 8/2001 | Reid ................. | H01L 21/76877 |
| | | | 205/291 |
| 2002/0033341 A1 | 3/2002 | Taylor et al. | |
| 2003/0070934 A1 | 4/2003 | Cobley et al. | |
| 2003/0089986 A1 | 5/2003 | Gilkes et al. | |
| 2003/0102223 A1 | 6/2003 | Shimo et al. | |
| 2003/0116439 A1 | 6/2003 | Seo et al. | |
| 2003/0119311 A1 | 6/2003 | Basol et al. | |
| 2004/0170753 A1 * | 9/2004 | Basol ................ | H01L 21/32125 |
| | | | 427/299 |
| 2004/0226827 A1 * | 11/2004 | Matsuda ............. | H01L 21/2885 |
| | | | 205/123 |
| 2004/0265562 A1 | 12/2004 | Uzoh et al. | |
| 2005/0045485 A1 | 3/2005 | Shih et al. | |
| 2005/0274622 A1 | 12/2005 | Sun et al. | |

| | | | |
|---|---|---|---|
| 2006/0105565 A1 | 5/2006 | Liu et al. | |
| 2006/0154084 A1 | 7/2006 | Schuh et al. | |
| 2006/0223313 A1 | 10/2006 | Yoon et al. | |
| 2006/0243597 A1 | 11/2006 | Matefi-Tempfli et al. | |
| 2006/0252254 A1 | 11/2006 | Basol | |
| 2007/0287289 A1 * | 12/2007 | Haba .................. | H01L 21/2885 |
| | | | 257/E21.175 |
| 2009/0139873 A1 | 6/2009 | Wang et al. | |
| 2009/0162685 A1 | 6/2009 | Kobayashi et al. | |
| 2010/0126872 A1 | 5/2010 | Paneccasio, Jr. et al. | |
| 2010/0276292 A1 | 11/2010 | Webb et al. | |
| 2010/0300888 A1 | 12/2010 | Ponnuswamy et al. | |
| 2011/0076390 A1 | 3/2011 | Cerio, Jr. et al. | |
| 2011/0096138 A1 | 4/2011 | Grimshaw | |
| 2011/0284386 A1 | 11/2011 | Willey et al. | |
| 2012/0193238 A1 | 8/2012 | Park et al. | |
| 2013/0161203 A1 | 6/2013 | Mayer | |
| 2013/0244423 A1 | 9/2013 | Kolics | |
| 2013/0264213 A1 | 10/2013 | Roeger-Goepfert et al. | |
| 2013/0313123 A1 * | 11/2013 | Abraham ................. | C25D 5/08 |
| | | | 204/242 |
| 2013/0313124 A1 | 11/2013 | Macneil | |
| 2014/0120722 A1 | 5/2014 | Richardson et al. | |
| 2014/0138142 A1 | 5/2014 | Hu et al. | |
| 2014/0238868 A1 | 8/2014 | Li et al. | |
| 2014/0367279 A1 | 12/2014 | Brogan et al. | |
| 2015/0122661 A1 | 5/2015 | Woertink et al. | |
| 2015/0225866 A1 | 8/2015 | Lee et al. | |
| 2015/0233008 A1 | 8/2015 | Riege et al. | |
| 2015/0303065 A1 * | 10/2015 | Buckalew ............... | H01L 24/03 |
| | | | 204/275.1 |
| 2016/0155685 A1 * | 6/2016 | Chen ..................... | H01L 23/481 |
| | | | 257/762 |
| 2016/0258078 A1 * | 9/2016 | Thorum ................. | C25D 7/123 |
| 2016/0265132 A1 | 9/2016 | Graham et al. | |
| 2016/0329067 A1 * | 11/2016 | Fischer ................. | H05K 3/182 |
| 2017/0058417 A1 | 3/2017 | Graham et al. | |
| 2017/0170111 A1 * | 6/2017 | Reingruber ....... | H01L 23/49822 |
| 2017/0342513 A1 | 11/2017 | Thorkelsson et al. | |
| 2017/0372952 A1 | 12/2017 | Birner et al. | |
| 2018/0010258 A1 | 1/2018 | Fujiwara et al. | |
| 2018/0258546 A1 | 9/2018 | Graham et al. | |
| 2019/0035640 A1 | 1/2019 | Thorkelsson et al. | |
| 2019/0103348 A1 * | 4/2019 | Manepalli ............... | H01L 24/16 |
| 2019/0106798 A1 * | 4/2019 | Verardo ................ | G03F 7/0037 |
| 2019/0122890 A1 | 4/2019 | Thorkelsson et al. | |
| 2021/0175084 A1 * | 6/2021 | Farooq ................... | C25D 5/022 |
| 2023/0026818 A1 | 1/2023 | Shin et al. | |

FOREIGN PATENT DOCUMENTS

| | | |
|---|---|---|
| JP | 2006024754 A | 1/2006 |
| JP | 2006225715 A | 8/2006 |
| JP | 2010515820 A | 5/2010 |
| JP | 2015001523 A | 1/2015 |
| JP | 2018505960 A | 3/2018 |
| JP | 2019065342 A | 4/2019 |
| JP | 2019127652 A | 8/2019 |
| KR | 20070031541 A | 3/2007 |
| KR | 20110047468 A | 5/2011 |
| KR | 20110096138 A | 8/2011 |
| KR | 20120018204 A | 2/2012 |
| KR | 20120030399 A | 3/2012 |
| KR | 20120070520 A | 6/2012 |
| KR | 20140113947 A | 9/2014 |
| KR | 20150051926 A | 5/2015 |
| KR | 20150078138 A | 7/2015 |
| KR | 20180110171 A | 10/2018 |
| TW | 201131023 A | 9/2011 |
| TW | 201827654 A | 8/2018 |

OTHER PUBLICATIONS

International Search Report and Written Opinion of the Searching Authority, dated Nov. 5, 2020, for International Patent Application No. PCT/US2020/070303.

(56)                    References Cited

OTHER PUBLICATIONS

International Preliminary Report on Patentability dated Feb. 10, 2022 issued in Application No. PCT/US2020/070303.
Chang et al. "Investigations of effects of bias polarization and chemical parameters on morphology and filling capability of 130 nm damascene electroplated copper", J. Vac. Sci. Technol. B 19(3), 2001. (Year: 2001), 8 pages.
CN Office Action dated Dec. 18, 2023 in CN Application No. 202080067446, with English Translation.
CN Office Action dated Jul. 1, 2024 in CN Application No. 201880068336.8 with English translation.
CN Office Action dated Jul. 4, 2024 in CN Application No. 202080067446.X with English translation.
International Preliminary Report on Patentability and written opinion dated Jul. 21, 2022 in Application PCT/US2021/012822.
International Preliminary Report on Patentability issued on Apr. 30, 2020 in PCT Application No. PCT/US2018/055916. 8 pages.
International Search Report and Written Opinion dated May 10, 2021 in PCT Application No. PCT/US2021/012822.
International Search Report and Written Opinion issued on Feb. 1, 2019 in Application No. PCT/US2018/055916. 10 pages.
KR Office Action dated Aug. 26, 2024 in KR Application No. 10-2020-7014241, with English Translation.
Li et al. "Through Silicon via Filling by Copper Electroplating in Acidic Cupric Methanesulfonate Bath", 2009 International Conference on Electronic Packaging Technology & High Density Packaging. (Year: 2009), 5 pages.
Richardson, T.B., "Challenges facing electrochemical deposition in wafer level packaging", May 2016. (Year: 2016), 34 pages.
"Rightscale 2019 State of the Cloud Report" Flexera, 2019.
TW Office Action dated Jul. 8, 2022, in Application No. TW107136267 with English translation.
U.S. Final Office Action dated Jan. 3, 2022 in U.S. Appl. No. 16/165,886.
U.S. Final Office Action dated Jan. 11, 2021, in U.S. Appl. No. 16/165,886.
U.S. Non-Final office Action dated Jul. 24, 2020, in U.S. Appl. No. 16/165,886.
U.S. Non-Final Office Action dated Jun. 11, 2024 in U.S. Appl. No. 17/758,496.
U.S. Non-Final office Action dated Jun. 28, 2021, in U.S. Appl. No. 16/165,886.
U.S. Restriction Requirement dated Mar. 18, 2024 in U.S. Appl. No. 17/758,496.
CN Office Action dated Dec. 13, 2024 in CN Application No. 201880068336.8, with English Translation.
JP Office Action dated Jan. 21, 2025 in JP Application No. 2022-542109, with English Translation.
KR Notice of Allowance dated Dec. 26, 2024 in KR Application No. 10-2020-7014241, with English Translation.
KR Office Action dated Feb. 4, 2025 in KR Application No. 10-2022-7006611, with English Translation.
U.S. Advisory Action dated Jan. 2, 2025 in U.S. Appl. No. 17/758,496.
U.S. Corrected Notice of Allowance dated Feb. 6, 2025 in U.S. Appl. No. 17/758,496.
U.S. Final Office Action dated Oct. 21, 2024 in U.S. Appl. No. 17/758,496.
U.S. Notice of Allowance dated Jan. 23, 2025 in U.S. Appl. No. 17/758,496.
CN Office Action dated Feb. 28, 2025 in CN Application No. 201880068336.8, with English Translation.
JP Decision to Grant and Search Report dated Jun. 17, 2025 in JP Application No. 2022-542109, with English translation.
KR Office Action dated Apr. 22, 2025 in KR Application No. 10-2022-7027505, with English Translation.
U.S. Appl. No. 19/189,931, inventors Shin J et al., filed Apr. 25, 2025.
KR Office Action dated Oct. 24, 2025 in KR Application No. 10-2022-7006611, with English Translation.

* cited by examiner

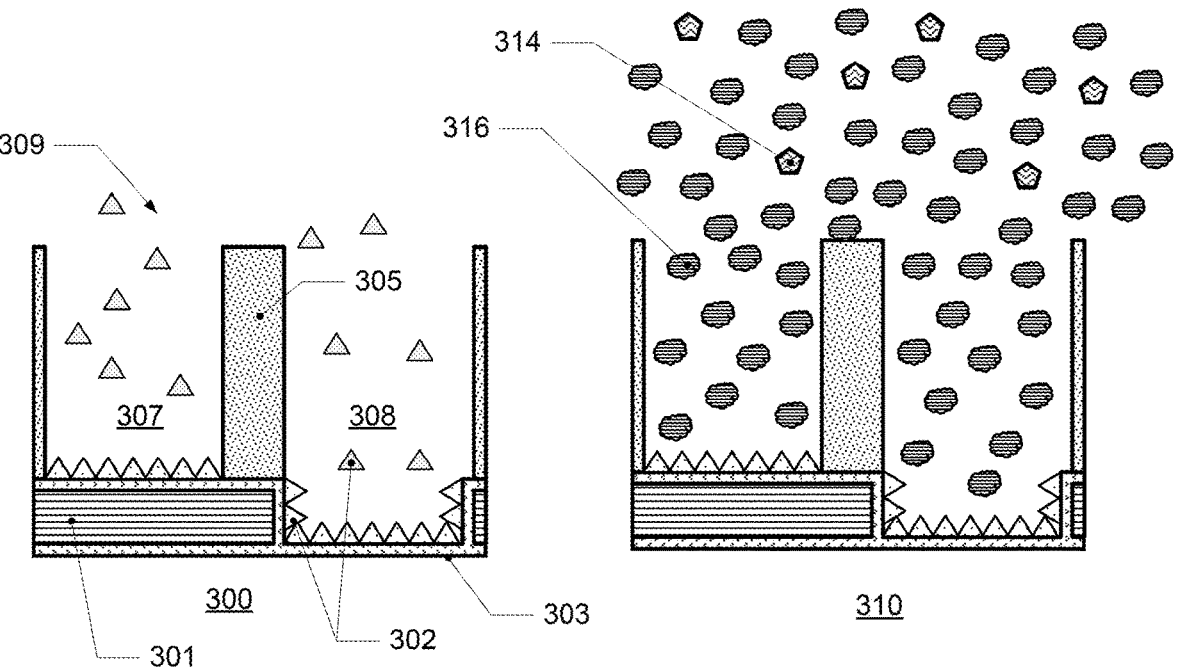
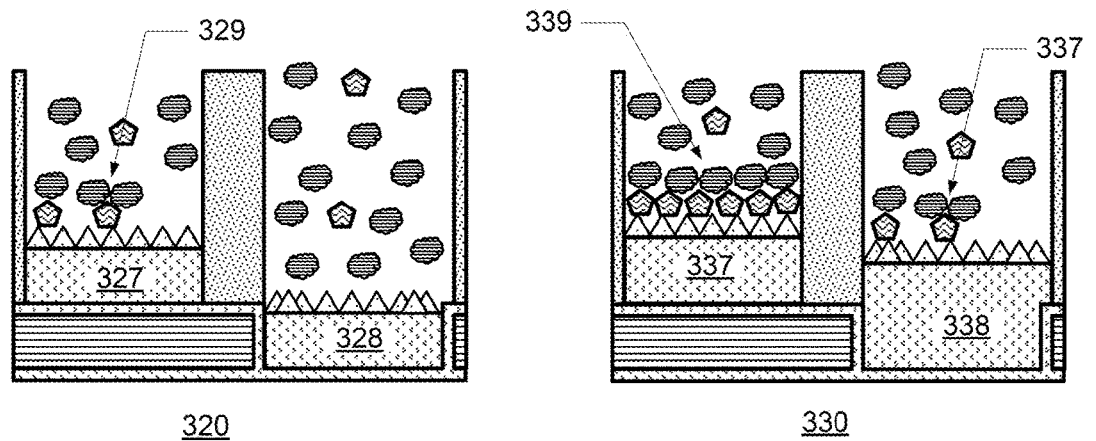
FIG. 3A

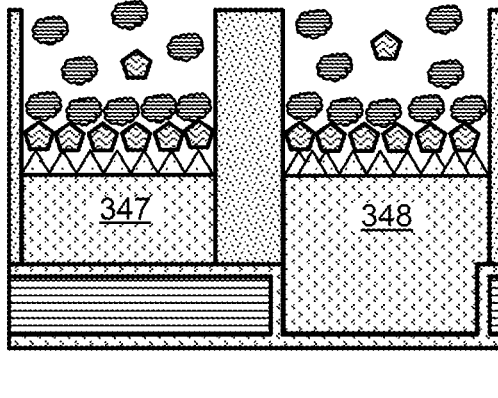
340
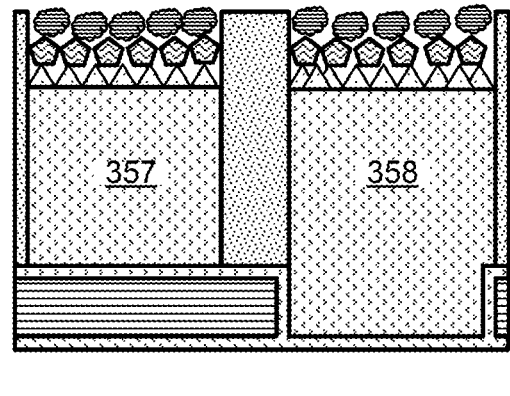
350
360
FIG. 3B

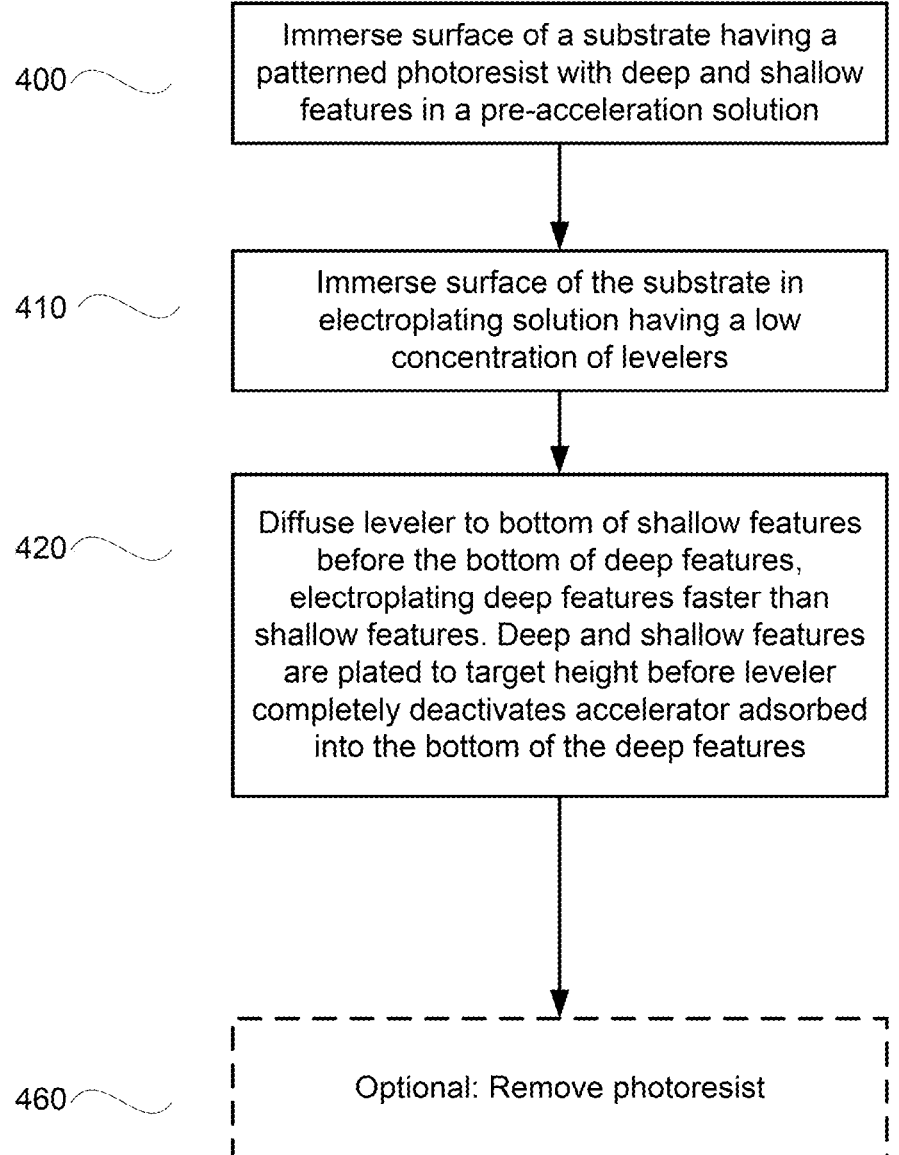

400 — Immerse surface of a substrate having a patterned photoresist with deep and shallow features in a pre-acceleration solution 410 — Immerse surface of the substrate in electroplating solution having a low concentration of levelers 420 — Diffuse leveler to bottom of shallow features before the bottom of deep features, electroplating deep features faster than shallow features. Deep and shallow features are plated to target height before leveler completely deactivates accelerator adsorbed into the bottom of the deep features 460 — Optional: Remove photoresist

*FIG. 4*

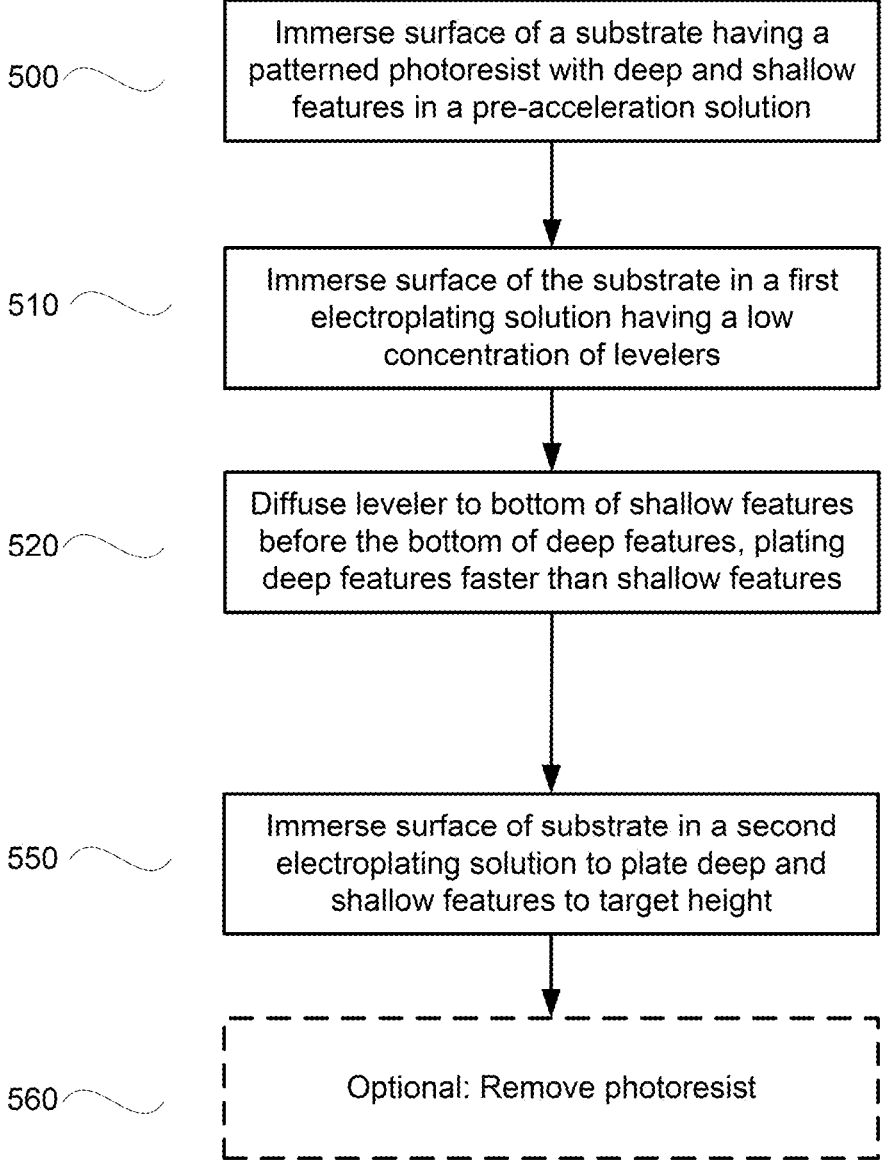

500  Immerse surface of a substrate having a patterned photoresist with deep and shallow features in a pre-acceleration solution 510  Immerse surface of the substrate in a first electroplating solution having a low concentration of levelers 520  Diffuse leveler to bottom of shallow features before the bottom of deep features, plating deep features faster than shallow features 550  Immerse surface of substrate in a second electroplating solution to plate deep and shallow features to target height 560  Optional: Remove photoresist

*FIG. 5*

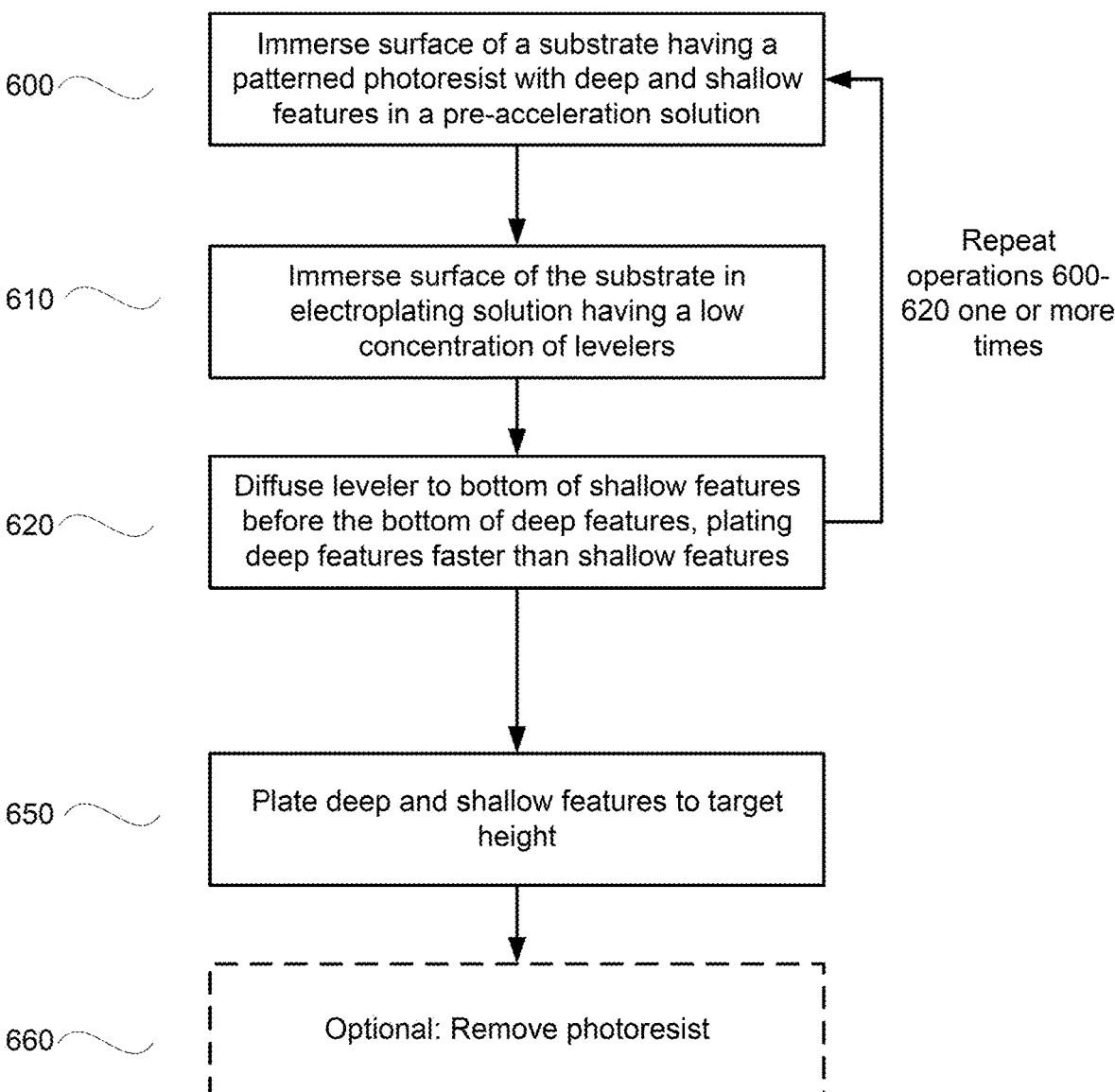

600

Immerse surface of a substrate having a patterned photoresist with deep and shallow features in a pre-acceleration solution

610

Immerse surface of the substrate in electroplating solution having a low concentration of levelers

620

Diffuse leveler to bottom of shallow features before the bottom of deep features, plating deep features faster than shallow features Repeat operations 600-620 one or more times

650

Plate deep and shallow features to target height

660

Optional: Remove photoresist

DIFFERENTIAL CONTRAST PLATING FOR ADVANCED PACKAGING APPLICATIONS

INCORPORATION BY REFERENCE

An Application Data Sheet ("ADS") is filed concurrently with this specification as part of the present application. Each application that the present application claims benefit of or priority to as identified in the concurrently filed ADS is incorporated by reference herein in its entirety and for all purposes.

BACKGROUND

Electrolyte solutions, e.g. metal plating baths, used in wafer-level-packaging applications typically are designed to produce acceptable within-die (WID), within-wafer (WIW) and within-feature (WIF) non-uniformity at acceptable deposition purity. Such non-uniformity is produced at acceptable electroplating rates by controlling the concentration of metal and acid in solution for the plating bath, as well as the selection of an additive package applied to the plating bath. However, different feature depths may result in substantial feature or pillar, non-uniformity. Further technical challenges may arise while seeking to optimize plating bath chemistry to achieve ideal WID, WIW and WIF non-uniformity at acceptable electroplating rates and purities.

Background and contextual descriptions contained herein are provided solely for the purpose of generally presenting the context of the disclosure. Much of this disclosure presents work of the inventors, and simply because such work is described in the background section or presented as context elsewhere herein does not mean that it is admitted to be prior art.

SUMMARY

Disclosed herein are methods and systems of electroplating metal into recessed features of a patterned substrate having substantially different depths. In one aspect of the embodiments herein, a method of electroplating a metal into features of a partially fabricated electronic device on a substrate is described, the method including: (a) exposing a surface of a substrate to a pre-acceleration solution including an accelerator compound, wherein the surface of the substrate comprises features in a layer of photoresist on the substrate and wherein the features comprise a metal seed layer; (b) immersing at least the surface of the substrate in an electroplating solution including ions of the metal, a suppressor, and a leveler of a type that reduces a plating rate of more exposed regions of the substrate surface relative to more recessed regions of the substrate surface; (c) while the surface of the substrate is immersed in the electroplating solution, electroplating the metal into the features to partially fill the features; and (d) removing the substrate from electroplating solution. In some embodiments the surface of the substrate in (a) becomes saturated with accelerator compound. In some embodiments the leveler reduces the plating rate of more exposed regions of the substrate surface relative to more recessed regions of the substrate surface by polarizing deposition at the more exposed regions of the substrate surface relative to more recessed regions of the substrate surface or by reducing the depolarization effect of the accelerator compound at the more exposed regions of the substrate surface relative to more recessed regions of the substrate surface. In some embodiments the features in the layer of photoresist on the substrate have different depths, different loadings, different shapes, and/or different critical dimensions when viewed top down toward the substrate, and combinations thereof.

In various embodiments the leveler is characterized by producing an electrochemical response in the following test: (i) contacting a test solution having an known concentration of the leveler with a metal surface of a test electrode substantially saturated with the an accelerator compound; (ii) measuring the electrochemical response while plating the test electrode in the test solution having the known concentration of the leveler; and (iii) determining that the electrochemical response has at least a threshold magnitude. In various implementations, the test solution has a known concentration of leveler between about 0.1 and about 50 ppm. In various implementations, the test solution has a known concentration of leveler between about 1 and about 25 ppm. In various implementations, the test electrode is a rotating disk electrode. In some embodiments the metal is copper. In various embodiments the pre-acceleration solution comprises 0.05 to 10 g/L accelerator compound in deionized water or weak acid.

In some embodiments the accelerator compound is a mercapto sulphonic acid compound or a dimercapto sulphonic acid compound. In various embodiments the accelerator compound is selected from the group consisting of mercaptopropane sulfonic acid, dimercaptopropane sulfonic acid, tnercaptoethane sulfonic acid, dimercaptoethane sulfonic acid, and bis-(3-sulfopropyl)-disulfide. In some embodiments the electroplating solution comprises no accelerator or accelerator at a concentration of less than about 1 ppm. In some embodiments the leveler in the electroplating solution is selected from the group consisting of polyethylenimines, polyamidoamines, dialkylamines, trialkylamines, aryalkylamines, triazoles, imidazoles, tetrazoles, benzimidazoles, benzotriazoles, piperidine, morpholine, piperazine, pyridine, oxazole, benzoxazole, pyrimidine, quonoline, isoquinoline, and epihalohydrins.

In various embodiments the suppressor in the electroplating solution is selected from the group consisting of polyethylene glycols, polyethylene oxides, polypropylene glycols, and polypropylene oxides. In some embodiments exposing the surface of a substrate to the pre-acceleration solution including an accelerator compound is performed in a first chamber and electroplating the metal into the features to partially fill the features is performed in a second chamber. In some embodiments, the first chamber is operated at sub-atmospheric pressure while exposing the surface of a substrate to the pre-acceleration solution including an accelerator compound. In some embodiments metal pillars are formed during (c) having top surfaces that deviate from co-planarity by less than bottom surfaces of the features prior to the electroplating in (c). In some embodiments pillars are formed during the electroplating (c) having less non-uniformity than the features in the layer of photoresist prior to the electroplating in (c).

In some embodiments, the method further includes: stopping electroplating metal in (c) before the features in the layer of photoresist are fully filled; immersing at least the surface of the substrate in a second electroplating solution including ions of the metal, and an additive composition that is different from that in the electroplating solution used in (b) and (c); and electroplating more of the metal into the features in the layer of photoresist, to further fill the features, while contacting the features with a second electroplating solution. In some embodiments, the second electroplating solution comprises a greater concentration of leveler and accelerator than are present in the electroplating solution used in (b) and (c).

In some embodiments, the method further includes: stopping the electroplating metal in (c) before the features in the layer of photoresist are fully filled; again exposing the surface of a substrate to the pre-acceleration solution and allowing the surface of the substrate, as partially electroplating with the metal, to become substantially saturated with the accelerator compound; and electroplating additional metal in the features in the layer of photoresist using a second electroplating solution. In some embodiments the electroplating in (c) produces metal pillars that are a component of wafer level packaging. In some embodiments, the method further includes forming a contact between the metal pillars and a tin silver composition. In various embodiments the features in the layer of photoresist on the substrate are holes, and wherein electroplating the metal in operation (c) forms metal pillars in the holes. In various implementations, the bases of the holes comprise a conductive seed layer.

In some embodiments the features in the layer of photoresist have an average depth of at least about 20 to 70 μm. In some embodiments the features in the layer of photoresist have an average depth of at least about 5 μm. In some embodiments the features in the layer of photoresist have an average depth of at most about 270 μm. In some embodiments the features in the layer of photoresist have an average width of at least about 10 to 100 μm. In some embodiments the features in the layer of photoresist have a difference in depth between deepest and shallowest features of at least about 5 microns. In some embodiments the shallowest feature in the layer of photoresist is at least about 5% shorter than the deepest feature in the layer of photoresist. in some embodiments the shallowest feature in the layer of photoresist is at least about 10% shorter than the deepest feature in the layer of photoresist. In some embodiments at least some of the features in the layer of photoresist have an aspect ratio of between about 1:2 and 10:1.

In various implementations, during electroplating in (c), the deepest feature has a mass transfer boundary layer in the electroplating solution having a thickness of less than about 50 micrometers, In some embodiments during electroplating in (c), fluid velocity near the substrate surface is between about 0.1 and 1.0 m/s and the fluid flow is at least partially laminar. In some embodiments during electroplating in (c), leveler diffuses into shallow features faster than deep features, reducing the electroplating rate in shallow features compared to deep features. In some implementations, at least one of the deep features is at least 5% deeper than at least one of the shallow features.

These and other features of the disclosed embodiments will be described in detail below with reference to the associated drawings.

BRIEF DESCRIPTION OF DRAWINGS

FIGS. 3A and 3B present an illustration of one example embodiment.

FIG. 4 presents another flow diagram of an operation for an example embodiment.

FIG. 5 presents another flow diagram of an operation for an example embodiment.

FIG. 6 presents another flow diagram of an operation for an example embodiment.

FIGS. 8-12 are schematic diagrams of examples of process chambers for performing methods in accordance with disclosed embodiments.

DETAILED DESCRIPTION

Context and Overview

Figure 1:
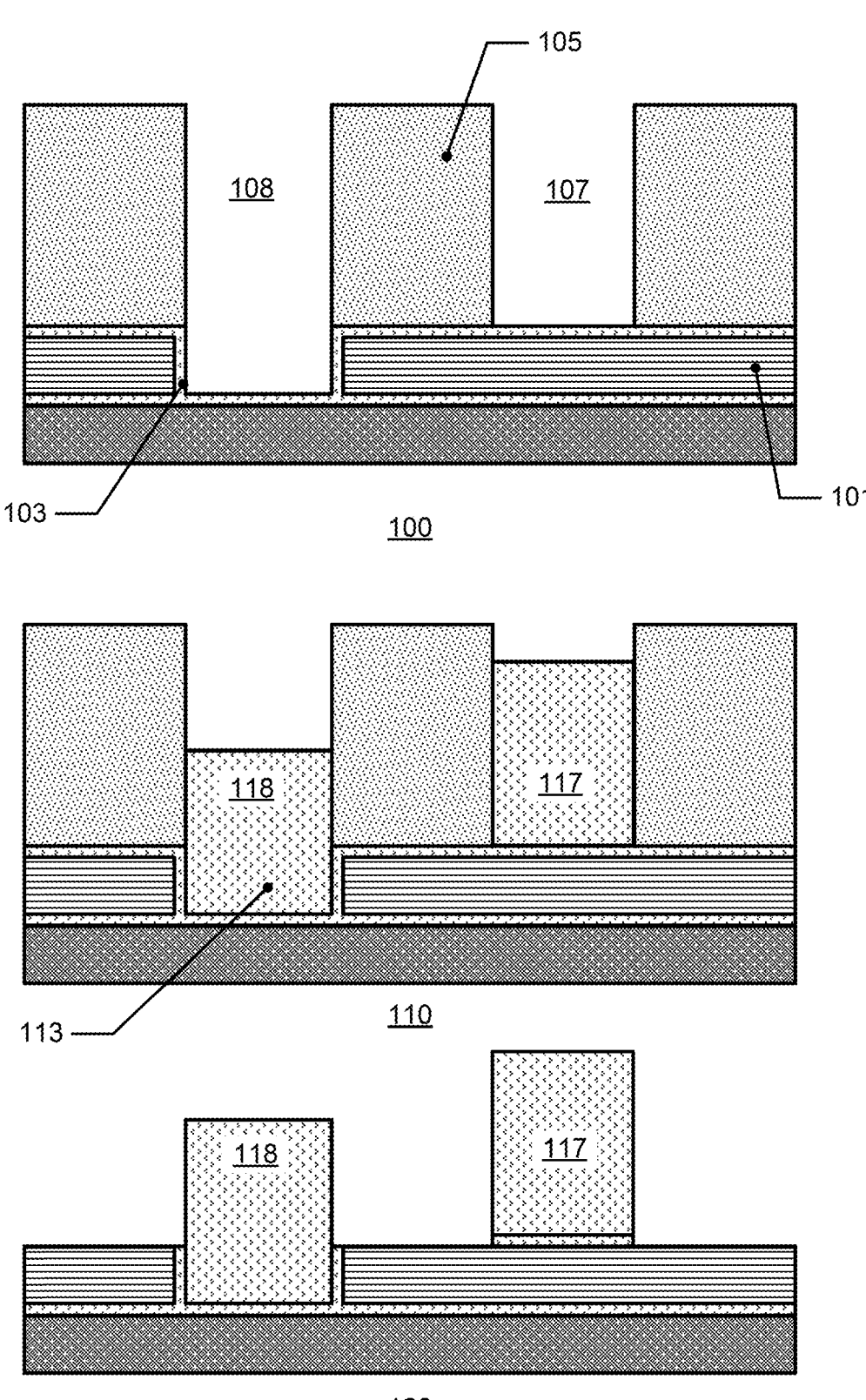
FIG. 1 presents an illustration of a substrate with non-planar feature fill.

Methods and apparatuses for producing acceptable feature non-uniformity of metal pillars and/or bumps on semiconductor substrates in wafer-level-packaging (WLP) and other applications are provided herein. Wafer-level packaging, as generally understood by those skilled in the art, refers to the technology of packaging an integrated circuit (IC) while it is still part of the wafer, in contrast to conventional methods of slicing a wafer into individual circuits (die) and then packaging them.

Electroplating through a lithographic mask, or photoresist (PR), is often used to form metal bumps and pillars in advanced semiconductor device fabrication such as in WLP applications. A typical process using through-mask electroplating may involve the following process operations. First, a substrate (e.g., a semiconductor substrate having a planar exposed surface) is coated with a thin conductive seed layer material (e.g., Cu) that can be deposited by any suitable method, such as physical vapor deposition (PVD). Next, a non-conductive mask layer, such as a PR, is deposited over the seed layer and is patterned to define recessed features (e.g., round or polygonal holes). The patterning exposes the seed layer at the bottom of each recessed feature. After patterning, the exposed surface of the substrate includes portions of non-conductive mask in the field region, and conductive seed layer at the bottom portions of the recessed features.

Through-mask electroplating (or, in the case of usage of a PR, through-resist electroplating) may involve positioning of the substrate in an electroplating apparatus such that electrical contact is made to the seed layer at the periphery of the substrate. The apparatus houses an anode and an electrolyte that contains ions of a metal intended to be used for plating. The substrate is cathodically biased and immersed into an electrolyte solution, which provides metal ions that are reduced at the surface of the substrate, as described in the following equation, where M is a metal (e.g., copper), and n is the number of electrons transferred during the reduction:

$$M^{n+} + ne^- \rightarrow M^0$$

Because the conductive seed layer is exposed to the electrolyte solution only at the bottom portions of the recessed features, electrochemical deposition, e.g. as facilitated by a through-mask electroplating process, occurs only within the recessed features, and not on the e.g, a top layer of the mask or PR exposed to the electrolyte solution. Thus, through-mask electroplating may be used to at least partially fill recesses in the mask with metal. Finally, after electroplating, the mask or PR may be removed by a conventional stripping method to thus result in the substrate having a number of free standing metal bumps or pillars.

It is typically desirable for the rate of deposition within recessed features to be uniform, i.e. at the end of the process each feature has a similar height of metal deposited and is thus co-planar. However, a uniform deposition rate may be undesirable when recessed features have substantially different depths, as the height of the metal bumps or pillars after stripping the mask or PR will be non-uniform and/or non-planar. FIG. 1 is an illustration of a problem that may arise when recessed features have substantially different depths, e.g., depths that exhibit variation of at least about 5%; e.g., between about 5% and about 20%. A WLP structure 100 has a patterned PR 105 defining recessed features 107 and 108, where, for example, the depth of feature 107 may be between about 5% and about 20% less than the depth of feature 108. Structure 100 also has a seed layer 103 and a layer 101. Layer 101 may be, for example, a polyimide layer that is between about 2 and 20 um thick. Layer 101 may be deposited as a wet spin-on film that is patterned and then cured. Seed layer 103, which may be between about 5 and 600 nm thick, may be deposited using a physical vapor deposition (PVD) process.

A structure 110 is formed after electroplating structure 100 using a conventional process as described above. Pillars 117 and 118 are formed. As the rate of deposition in each recessed feature 107 and 108 was similar, the difference in height, relative to the substrate, is similar, such that pillar 117 is substantially higher than feature 118. Finally, a structure 120 is the result of stripping the PR 105 and the exposed portions of seed layer 103. As may be seen, the height of pillar 117 remains substantially higher than the height of pillar 118. In some circumstances, this difference may be at least about 1 μm. The non-uniformity that results from different heights of pillars is undesirable for WLP applications.

Co-planarity may be improved with an etch process, such as a electrochemical etching or polishing process, to reduce the height of taller pillars. In some embodiments a chemical mechanical planarization (CMP) process is used to etch back pillars, which may remove the PR or mask. Depending on downstream processes, the mask or PR may need to be reapplied, which may be expensive and time-consuming. An alternative etch process is an electro-oxidative method, which may be used to remove plated metal to improve co-planarity without removing the mask or PR. Such a method may be desirable if a downstream process uses the same mask or PR. Electro-oxidative metal removal is further explained in U.S. patent application Ser. No. 16/040,407 (to Thorkelsson et al.), which is hereby incorporated by reference in its entirety.

An alternative process to achieve improved uniformity is an electroplating process that electroplates faster in deep features (or deep within features) and comparatively slower in shallow features. This may be accomplished by carefully controlling the deposition conditions and particularly the use of plating additives such as levelers under conditions that limit the levelers' mass transport into the features, particularly the deep portions of the features. In certain embodiments, this is accomplished by a combination of exposing a surface of a substrate to a pre-acceleration solution prior to exposure to an electroplating solution, and using an accelerator-deactivating leveler in the electroplating solution. As described in reference to FIGS. 2 and 3A-B below, pre-treating the surface with accelerator molecules allows the metal deposition rate to start relatively high for both deep and shallow features. But over time during the electroplating process, accelerating deactivating leveler will diffuse into the features, reaching the bottom of the shallow features first. The leveler will deactivate the accelerator in shallow features, slowing down the deposition rate in shallow features while the deposition rate in deeper features remains higher. This allows for differential plating rates between deep features and shallow features, permitting the deeper features to fill to a height such that the top portions have the same height relative to the substrate as the shallow features before the leveler diffuses to the feature's bottom and causes the deposition rate to equalize. In some embodiments, a differential plating rate as described herein may be combined with an electro-oxidative method as described above.

Usage of pre-acceleration solution and an electroplating bath that causes differential plating rates between deep and shallow features improves or, at a minimum, balances various competing process qualities. For instance, process qualities such as within-die (WID) uniformity, within-feature (WIF) uniformity, within-wafer (WIW) uniformity, electroplating speed, and electroplating purity may each, or all, be improved and/or optimized. As referred to herein, the terms "non-uniformity" and "uniformity" generally refers to observed variation of the height of metal relative to the substrate plated in a target feature on a substrate. Thus, improvement of non-uniformity involves reducing unwanted variation of at least one process quality, e.g. WID.

Terminology

In this description, the term "semiconductor wafer" or "semiconductor substrate," or simply "substrate" refers to a substrate that has semiconductor material anywhere within its body, and it is understood by one of skill in the art that the semiconductor material does not need to be exposed. The semiconductor substrate may include one or more dielectric and conductive layers formed over the semiconductor material. A wafer used in the semiconductor device industry is typically a circular-shaped semiconductor substrate, which may have a diameter of 200 mm, 300 mm, or 450 mm, for example. The following detailed description describes electrochemical plating, also referred to as "electroplating" or "plating" for short, and the subsequent etching of material plated on a wafer. However, one skilled in the art will appreciate that suitable alternative implementations of that described herein exist, and that the disclosed electroplating operations may be conducted on work pieces of various shapes and sizes, and which are made from various materials. In addition to semiconductor wafers, other work pieces that may take advantage of the disclosed implementations include various articles such as printed circuit boards (PCBs) and/or the like.

Methods and apparatuses provided herein may be used to produce acceptable feature non-uniformity of metal electro-deposited in recessed features formed in a through-mask or PR provided on a semiconductor substrate, e.g. the metal being deposited in the form of metal pillars and/or bumps. Examples of metals that may be used include: copper (Cu), nickel (Ni), cobalt (Co), tin (Sn), and various alloys thereof. In certain embodiments, alloys of the listed metals include those formed with, e.g., noble metals, e.g. gold (Ag), where the noble metal is present in a small quantity, e.g., at 5 atomic % or less.

The term "feature" as used herein may refer to an unfilled, partially filled, or completely filled recess on a substrate. Likewise, the term "through-mask features" refer to unfilled, partially filled or completely filled recessed features formed in a dielectric mask layer, such as in a photoresist (PR) layer. Such through-mask features are formed on a conductive seed layer. Thus, substrates having unfilled or partially filled through-mask features may include an exposed discontinuous metal layer and an exposed dielectric layer. In certain embodiments, the exposed discontinuous metal layer may be electrically connected by an additional conductive layer positioned beneath the dielectric layer. In some embodiments, the features in a PR layer may have different depths, different loadings, different shapes when viewed top down toward the substrate, and combinations thereof. In some embodiments, some features of the substrate may have round, oblong, or rectangular shapes when viewed from above. As discussed herein, deep features have a greater depth than shallow features, and deep features may be at least about 5%, 10%, 15%, or 20% deeper than shallow features.

While the description below refers chiefly to semiconductor substrates, the methods may also be applied to other types of substrates that any of a variety of different materials and electrical properties. Additionally, the description below refers to a patterned photoresist, but the methods described may also be used with any of a variety of non-conductive patterned masks.

The term "suppressor" as used herein may refer to a compound that leads to a general increase in the resistance to charge transfer across an electrolyte-electrode interface. While not wishing to he bound to any theory or mechanism of action, it is believed that suppressors (either alone or in combination with other bath additives) are surface-kinetic polarizing compounds that lead to a significant increase in the voltage drop across the substrate-electrolyte interface. The suppressor may (1) increase the local polarization of the substrate surface at regions where the suppressor is present relative to regions where the suppressor is absent, and (2) increase the polarization of the substrate surface generally. The increased polarization (local and/or general) corresponds to increased resistivity/impedance and therefore slower plating at a particular applied potential.

To exhibit the desired polarization behavior, suppressors may require a small amount of a halide such as chloride or bromide (e.g., about 50 ppm). The chloride is also not significantly consumed during the plating process but stays at the surface as the surface grows. The halide may act as a chemisorbed-bridge between the suppressor molecules and the wafer surface.

In certain embodiments, suppressors are not appreciably consumed by electrochemical processing but stay at the surface as the surface grows during electroplating. In certain embodiments, suppressors, do not exhibit appreciable variability (increases) in polararization with increases concentrations or convective transport. Suppressors may not be significantly incorporated into the deposited film, though they may slowly degrade over time by electrolysis or chemical decomposition in the bath.

Suppressors are often relatively large molecules, and in many instances they are polymeric in nature (e.g., polyethylene oxide, polypropylene oxide, polyethylene glycol, polypropylene glycol, etc). Other examples of suppressors include polyethylene and polypropylene oxides with S- and/or N-containing functional groups, block polymers of polyethylene oxide and polypropylene oxides, etc. The suppressors can have linear chain structures or branch structures or both. It is common that suppressor molecules with various molecular weights co-exist in a commercial suppressor solution. Due in part to suppressors' large size, the diffusion of these compounds into a recessed feature can be relatively slow compared to other bath components.

The term "accelerator" as used herein, in particular a copper plating accelerator, is a compound that is, or can be chemically converted to, a species that strongly bonds or attaches to the plating surface. A surface being pretreated with an accelerator, or having had a reduced accelerator precursor molecule react and become bonded to it in a solution containing halide/suppressors, is significantly less polarized than the same surface exposed to a suppressor/halide copper plating solution without being treated with or containing an accelerator. Therefore, accelerators tend to locally reduce the polarization effect associated with the presence of suppressors, and thereby locally increase the electrodeposition rate. The reduced polarization effect is most pronounced in regions where the adsorbed accelerator is most concentrated (i.e., the polarization is reduced as a function of the local surface concentration of adsorbed accelerator).

The accelerator molecules on a plating surface tend to "float" or stay in the vicinity of the surface and therefore remain active during the electroplating process. Although the accelerator may become strongly adsorbed to the substrate surface and generally laterally-surface immobilized as a result of the plating reactions, the accelerator is generally not significantly incorporated into the film. Thus, the accelerator remains on the surface as metal is deposited. As a recess is filled, the local accelerator concentration increases on the surface within the recess. Accelerators tend to be smaller molecules and exhibit faster diffusion into recessed features, as compared to suppressors.

While not wanting to be held to any particular model or theory, we theorized that the accelerator to metal bond is very strong and that when the bond breaks with the addition of a copper molecule in its place, it quickly reacts with another surface copper molecule rather than desorb and leave the surface. As a result, in the absence of any outside action to actively remove the accelerating molecule from the interface (for example by chemical or electrochemical etching, surface abrasion, or reaction with an accelerator deactivating leveling compound), the low level of polarization remains for a considerable amount of time (tens of minutes).

In certain embodiments, a suppressor molecule is a mercapto-hydrocarbon-sulphonic acid, where the hydrocarbon is methyl, propyl, butyl, etc. In certain embodiments, a suppressor molecule is a di mercapto-hydrocarbon-sulphonic acids, where again the hydrocarbon is methyl, propyl, butyl, etc. Example accelerators include, but are not limited to, dimercaptopropane sulfonic acid, ditnercaptoethane sulfonic acid, mercaptopropane sulfonic acid, mercaptoethane sulfonic acid, bis-(3-sulfopropyl) disulfide (SPS), and their derivatives.

The term "leveler" as used herein may refer to an accelerator deactivating leveler. Like all leveling compounds, when present, it has the net effect of reducing the plating rate of more exposed regions of a surface relative to more recessed regions. This result is opposite of what will naturally happen in its absence: exposed regions will plate faster due to chemical transport n the plating solution and exposure to electric fields. An accelerator deactivating leveler promotes leveling by interfering with an accelerator's activity on exposed regions of a substrate surface. It may accomplish this by increasing the polarization of a surface that has an adsorbed accelerator on it, particularly in a plating solution that contains suppressors and halide. Under the action of a plating solution containing accelerator deactivating leveler, the polarization of exposed regions containing accelerator approaches the polarization exhibited by an accelerator free surface in the presence of a suppressor/and halide. In other words, accelerator deactivating levelers (either alone or in combination with other bath additives) act as suppressing agents by counteracting the depolarization effect of accelerators, especially in exposed or slightly recessed portions of a substrate The local concentration of levelers is determined to some degree by mass transport. Therefore levelers act principally on surface structures having geometries that are relatively easy to reach, e.g., regions protrude away from the surface or are in shallow recesses. This action "smooths" the surface of the electrodeposited layer. It is believed that in many cases the leveler reacts or is consumed at the substrate surface at a rate that is at or near a diffusion limited rate, and therefore, a continuous supply of leveler is often beneficial in maintaining uniform plating conditions over time.

Leveler compounds are generally classified as levelers based on their electrochemical function and impact and do not require specific chemical structure or formulation. However, in certain embodiments, levelers often contain one or more nitrogen atoms, such as in amine, imide or imidazole group. In certain embodiments, levelers may alternatively or additionally contain sulfur functional groups. Certain levelers include one or more five or six member rings and/or conjugated organic compound derivatives. Nitrogen groups may form part of the ring structure. In amine-containing levelers, the amines may be primary, secondary, tertiary, or quaternary ammonium alkyl amines. In some cases, the amine is an aryl amine or a heterocyclic amine. Example nitrogen-containing leveler compounds include, but are not limited to, dialkylamines, trialkylamines, arylalkylamines, triazoles, imidazoles, triazole, tetrazole, benzimidazole, benzotriazole, piperidine, morpholines, piperazine, pyridine, oxazole, benzoxazole, pyrimidines, quonoline, and isoquinoline. Imidazole and pyridine are commonly used. Other examples of levelers include Janus Green B and Prussian Blue. Some leveler compounds include ethoxy groups. For example, some levelers include a backbone similar to that found in polyethylene glycol or polyethyelene oxide, but with fragments of amine functionally inserted over the chain (e.g., Janus Green B). Some leveler compounds include epoxide groups. Example epoxides include, but are not limited to, epihalohydrins such as epichlorohydrin and epibromohydrin, and polyepoxide compounds. Polyepoxide compounds having two or more epoxide moieties joined together by an ether-containing linkage are sometimes used. Some leveler compounds are polymeric. Example polymeric leveler compounds include, but are not limited to, polyethylenimine, polyamidoamines, and reaction products of an amine with various oxygen epoxides or sulfides. One example of a non-polymeric leveler is 6-mercapto-hexanol. Another example leveler is polyvinylpyrrolidone (PVP).

Leveling compounds are further discussed and described in US Patent Publication No. 2009/0139873, which is herein incorporated by reference in its entirety.

Process Flows

In through-resist plating, a recessed feature on a plating surface is plated with metal from the bottom to the top of the feature. Typically, copper is electroplated within features defined in PR-coated silicon wafers from a plating bath to produce pillars for WLP applications. Copper provided by copper sulfate in solution with, for example, sulfuric acid in a plating bath is selected to provide an acceptable plating performance, which may be measured by WID, WIW and WIF at an acceptable plating rate. It is important to control the deposition rate within the feature to achieve uniform filling, avoid incorporating voids into the features, and avoid creating nodules, roughness, or excessive doming or skirting. The three types of additives described above are beneficial in accomplishing through-resist fill, working together to selectively increase or decrease the polarization at different locations on the substrate surface, or provide other benefits such as brightening the surface or refining grain structure.

In some embodiments, the substrate is first immersed or otherwise brought in contact with in a pre-acceleration solution to adsorb accelerator into a seed layer at the bottom of the recessed features. After the substrate is coated with the pre-acceleration solution, it is immersed in the electroplating solution containing, e.g., a high concentration of suppressor and a low concentration of leveler. The suppressor and leveler adsorb onto the surface of the substrate, polarizing electrodeposition.

In the later stages of plating, particularly if features of different heights continue to fill at the same rate, the top surfaces of resulting pillars will have different heights. Leveler may be used to counteract this effect. In conventional electroplating processes, surface concentration of leveler is greatest at exposed regions of a surface (i.e., not within recessed features) and where convection is greatest. It is believed that the leveler, if it is of a certain chemical type, displaces accelerator, increases the local polarization and decreases the local plating rate at regions on or near the surface that would otherwise be plating at a rate greater than at other locations on the deposit. In other words, in conventional processes, the leveler tends, at least in part, to reduce or remove the influence of an accelerating compound at the exposed regions of a surface, particularly at protruding structures. Leveler may affect polarization by acting as a diffusion limited suppressing compound that is then incorporated into the deposited metal. Without leveler, a feature may tend to be domed or to overfill and produce a bump. Therefore, levelers are beneficial in producing a relatively flat deposit.

For WLP electroplating applications, leveler may be used to improve feature shape (reducing WiF non-uniformity, for example by flattening out feature doming), or to improve co-planarity (reducing bump height differences within a die). In certain embodiments disclosed herein, accelerator deactivating leveler is used under conditions that create differential plating rates between deep and shallow features. At comparatively low concentrations, transport of levelers into deep features may be diffusion limited in that leveler molecules diffuse to upper and mid reaches of deep features long before diffusing into deep regions of the features. Stated another way, the local electroplating conditions may be controlled such that the mass flux of leveler is significantly greater in the upper reaches of most features than in the lower reaches. These effects result in a decreased plating rate for shallow features and in the upper reaches of all features. Deep features may plate at an overall faster rate than shallow features until the deep features fill with metal to near the field regions of the PR or other mask. This carefully balanced mass transport of leveler molecules allows the height of top portions relative to the substrate of metal deposits in deep features to approach the height of top portions relative to the substrate of metal deposits in shallow features, particularly by the time the electroplating process concludes.

Figure 2:
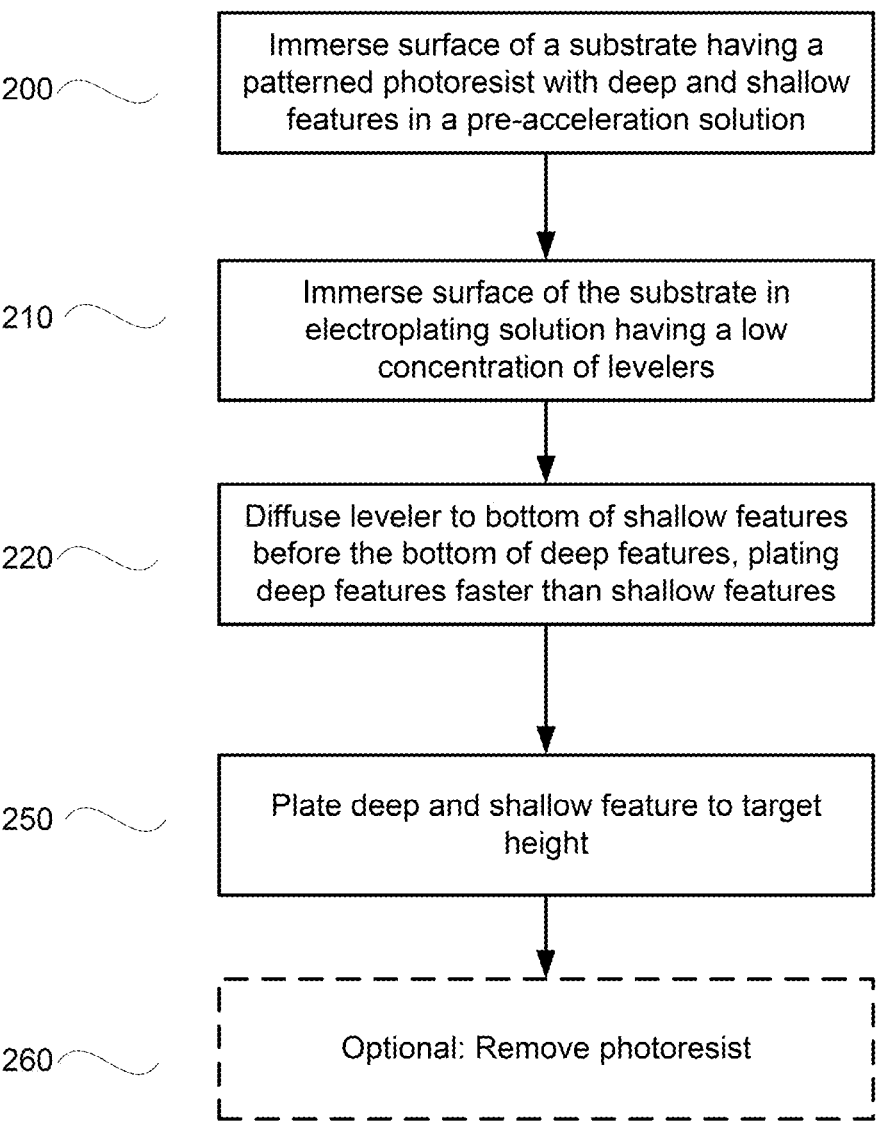
FIG. 2 presents a flow diagram of an operation for one example embodiment.

FIG. 2 is a process flow diagram showing an example of relevant operations employed to plate metal into recessed features of a substrate. In an operation 200 a surface of a substrate is immersed in a pre-acceleration solution. The substrate has a patterned photoresist (PR) with features having different geometric properties such as different depths, different shapes, and/or different loadings. In some embodiments, a depth of the deep features is at least 5% larger than the depth of the shallow features. At the bottom of features is a metal seed layer that was deposited in a prior operation. The pre-acceleration solution includes accelerator molecules that adsorb onto the bottom of the features, attaching to the metal seed layer. The surface of the substrate is immersed in the pre-acceleration solution for a sufficient time to saturate the bottom of each feature with accelerator.

The exact time of contact, the accelerating compound(s) used and their concentrations, may be sufficient to achieve a saturation state. At this saturation state, higher accelerator doses (higher concentrations and/or exposure times) will generally result in no measureable change in the electrochemical properties of the surface.

In an operation 210 the surface of the substrate is then immersed in an electroplating solution. The electroplating solution may include accelerators, suppressors, and levelers as described herein. In some embodiments the electroplating solution includes a comparatively low concentration (in comparison to conventional WLP electroplating baths) of leveler, such that, during electroplating, transport of leveler into deep reaches of at least relative deep features will be diffusion limited. Leveler will generally diffuse to the bottoms of shallow features faster than to the bottoms of deeper features.

Thus, as anticipated, during electroplating leveler diffuses to the bottom of shallow features. See operation 220. As leveler reaches the bottom of shallow features, it deactivates accelerator that is adsorbed into the bottom of the features. The mechanism of deactivation may vary, but generally results in an increased polarization of the surface of the bottom of shallow features. The increased polarization, in turn, reduces the plating rate. Notably, at this stage leveler has not reached the bottom of deeper features.

As plating continues, with deep features plating faster than shallow features, Leveler has reached the bottom of shallow features, but has not yet diffused to the bottom of deep features and deactivated accelerators adsorbed onto the bottom surface. The deep features, having a lower polarization than the shallow features (or at least shallow reaches of the features), plate at a faster rate.

Ultimately, during the electroplating process, leveler diffuses to the bottom of deep features and/or the plated metal reaches mid to upper levels of the recessed features. In this realm, leveler molecules interact with metal and adsorbed accelerator in all features, and thereby deactivate accelerator. Notably, when the leveler has reached the bottom of the deep features, metal pillars being formed in the deep features have a top portion with a height (or elevation), relative to the substrate, closer to the height of top portions of metal pillars formed in the shallow features. In other words, the tops of the features approach a common plane.

In an operation 250, the electroplating process concludes and the deep and shallow features are formed to a target height. Leveler has at least partially deactivated accelerator and decreased the plating rate for both types of features. Thus, the plating rate is relatively uniform across features. Plating may continue until a target height is reached for the metal pillars. The heigh of metal pillars in deep features may be greater than the height of metal pillars in shallow features, but the height of all pillars relative to the substrate will be similar, increasing co-planarity of the substrate.

Optionally, in an operation 260 the photoresist (or mask) is removed. The photoresist may be removed by various methods, such as aching. Removing the photoresist results in a substrate having a plurality of metal features, including pillars.

FIGS. 3A and 3B show schematic cross-sectional presentations of a portion of a semiconductor substrate undergoing processing, e.g., as indicated by the process flow diagram shown in FIG. 2. The process initiates as illustrated in the top left panel 300 of FIG. 3A, where a surface 309 of a substrate is immersed in a pre-acceleration solution containing accelerator molecules 302. Surface 309 comprises a patterned PR 305 defining a shallow feature 307 and a deep feature 308. The bottoms of feature 307 and feature 308 include a metal seed layer 303, such as a copper layer. In some embodiments the metal seed layer 303 is at least partially disposed upon a layer 301 (e.g., a dielectric layer, such silicon oxide, or an adhesive layer, such as polyimide (PI)). It will be understood by one skilled in the art that layer 301 may reside over one or more other layers (not shown in the figures), which may include semiconductor material, such as silicon (Si), germanium (Ge), silicon germanium (SiGe), etc. The difference in depth between feature 307 and 308 may result from layer 301 or any layer that causes uneven recessed feature depths.

In certain embodiments, the structure shown in FIG. 3A may be produced by providing a semiconductor substrate with exposed supporting layer 301 (e.g., a dielectric layer). A conductive layer, e.g., seed layer 103, may be deposited over the exposed supporting layer 303 by any suitable method (e.g., physical vapor deposition (PVD)). PR layer 305 may then be deposited over seed layer 303 by, for example, spin-coating. PR layer 305 may be later patterned by a photolithographic technique to define recessed features, such as shallow feature 307 and deep feature 308. The dimensions of the recessed features may vary depending per application, and may typically have widths of between about 5-250 μm, and aspect ratios of between about 1:2-15:1. In certain embodiments, attaining acceptable non-uniformity for the WID, WIW and WIF metrics may prove especially difficult at high plating rates required for large, e.g. greater than 200 μm tall, pillar applications.

In panel 300 the substrate is exposed to a pre-accelerator solution, which allows accelerator molecules 302 to adsorb onto and optionally saturate the exposed portions of metal seed layer 303. As illustrated, accelerator molecules do not adsorb into the PR layer 305. The adsorbed accelerator molecules reduces the polarization of the bottom surface of features 307 and 308, which increases the electroplating rate.

In panel 310 the surface 309 of the substrate is immersed in an electroplating solution. In certain embodiments, during electroplating, surface 309 may be cathodically biased by seed layer 303 exposed, as shown in FIG. 3A, and connected to a power supply (not shown in the figures). Surface 309 may be placed into an electroplating cell opposite an anode. Further, the contact surface of an electrolyte solution surrounding surface 309 includes ions of the metal to be plated on, for example, seed layer 303. Surface 309 may be immersed into the electrolyte to initiate electroplating to at least partially fill recessed features 307 and 308 with metal.

The electroplating solution comprises leveler molecules 314 and suppressor molecules 316. There are substantially more suppressors molecules than levelers molecules. Suppressor molecules may quickly diffuse into both deep and shallow features, but cannot adsorb or otherwise interact with the metal seed layer 303 due to the adsorbed accelerator 302. Leveler molecules, having a much lower concentration, do not diffuse into the features at the same rate as suppressors molecules. The deposition rate of metal into both feature 307 and 308 is high due to the adsorbed accelerator molecules. Leveler molecules and suppressor molecules are shown outside of features 307 and 308 in operation 310, but for ease of drawing, will only be shown within features in other operations.

In panel 320, the features are partially plated, forming metal pillars 327 and 328 in features 307 and 308, respectively. The plating rates in both feature 307 and feature 308 are similar, resulting in the of pillar 327 and pillar 328 to be the same, but the top portion, relative to the substrate, of pillar 327 to be substantially higher than the top portion pillar 328, in some embodiments at least 10% higher.

Additionally, in panel 320 leveler molecules have begun to diffuse to the bottom of shallow feature 307, interacting with and deactivating accelerator molecules adsorbed into the surface of pillar 327. Deactivating the accelerator molecules increases the polarization of the bottom of feature 307. Additionally, deactivating the accelerator molecules allows suppressor molecules to interact with the surface, increasing the polarization further. As polarization and plating rate have an inverse relationship, the plating rate in the shallow feature 307 starts to decrease in operation 320. Leveler molecules have not reached the bottom of deep feature 308 yet, thus the plating rate in feature 308 remains high.

In panel 330, plating continues in shallow feature 307 and deep feature 308. In feature 307, more leveler molecules have diffused to the bottom of feature 307, completely deactivating the accelerator molecules. Suppressor molecules are able to interact with the bottom surface of feature 307. This increases the polarization of the bottom surface of feature 307 and thereby decreases the plating rate. Pillar 327 has grown to become pillar 337.

In feature 308, leveler molecules have begun to diffuse to the bottom surface of feature 308, deactivating the accelerator molecules adsorbed into the bottom surface and increasing the polarization of the bottom surface. Thus, the plating rate in feature 308 is decreasing as well, but is still higher than the plating rate in feature 307, allowing the height of the top portion of pillar 337 to 'catch up' to the height of the top portion pillar 338. Pillar 338 in feature 308 is thicker than pillar 337 in feature 307, but the height of the top portion of pillar 338 relative to the substrate is still less than the height of the top portion of pillar 337.

In panel 340 of FIG. 3B, leveler molecules have diffused to and deactivated the accelerator molecules that adsorbed into the bottom surface of feature 307 and feature 308. Thus, suppressor molecules are able to interact with and increase the polarization of the bottom surface of both shallow feature 307 and deep feature 308. The plating rate in both features becomes roughly similar due to the similar effects of leveler molecules and suppressor molecules in both features. Additionally, feature 307 has plated to form a metal pillar 347, while feature 308 has plated to form a metal pillar 348. In some embodiments, the height of the top portion of pillar 347 and pillar 348, relative to the substrate, are similar when leveler molecules have diffused to the bottom of feature 308 and deactivated accelerator adsorbed into the bottom surface of feature 308.

In panel 350, both feature 307 and feature 308 plate at a similar rate until a target height is reached for a pillar 357 and pillar 358. The deposition rate may be slowed significantly due to the interaction of levelers and suppressors with the bottom surface of feature 307 and feature 308.

Finally, in panel 360 the PR 305 is removed, leaving pillars 357 and 358. The PR 305 may be removed by a variety of operations. In some embodiments, a separate process chamber is used to remove the PR. Pillar 357 and pillar 358 have different heights, but their top portions have the same height relative to the substrate, resulting in a co-planar surface.

FIGS. 4-6 present alternative embodiments for plating in deep and shallow features or in features having other types of variation. Some of the operations described in FIGS. 4-6 may be similar to those already described above, and may be performed in a similar manner.

In the process diagram of FIG. 4, operations 400-410 and 460 are substantially similar to operations 200-210 and 260, respectively as described above. The process diagram of FIG. 4 is different from the process diagram of FIG. 2 at operation 420. Operation 420 is similar to operation 220 in respect to how leveler is used to create a differential plating rate between deep features and shallow features. In the process diagram of FIG. 4, however the features are plated to a target height before leveler has completely deactivated accelerator adsorbed into the bottom of deep features. The deep features will have a faster plating rate than the shallow features from the time leveler first diffuses to the bottom of the shallow features until the target height of plating is achieved. This may be desirable to increase throughput, as once the leveler has deactivated accelerator, the plating rate decreases, requiring more time to achieve the target height. By choosing a leveler concentration and operating conditions that limit the diffusion of leveler to the of deep features, and hence the deactivation of accelerator and reduction in plating rate, to coincide with plating to the target height, the average plating rate in deep features may he maximized, increasing throughput.

In the process diagram of FIG. 5, operations 500-520 and 560 are substantially similar to operations 200-220 and 260, respectively as described above. The process diagram of FIG. 5 is different from the process diagram of FIG. 2 at operation 550. In operation 550 a substrate is immersed in a second electroplating solution. In some embodiments operation 550 occurs after leveler has deactivated accelerator in both shallow and deep features. In some embodiments operation 550 occurs after the deep feature has plated to a similar height of the top portion as the shallow features but before the features have completely filled. The second electroplating solution comprises a different plating chemistry that is not constrained by the need for differential plating rates in different types of features. The chemical composition may be adjusted in terms of plating species, acid, accelerator, suppressor, leveler, convection, plating rate, etc. to provide other improvements beyond co-planarity (e.g., smooth surface finish higher plating rate, and/or low impurity levels). For example, the electroplating solution in operation 510 may contain no accelerator compound, typical concentration of suppressor as discussed herein, and a leveler that acts to add polarization in a manner proportional to the rate of flux to the surface, where its concentration is optimized to reduce the contrast between the shallow and deep features. The second electroplating solution, however, may contain typical concentrations of accelerator and suppressor compounds, and a leveler compound concentration that is optimized to control deposit purity, feature shape, etc.

In operation 550 the deep and shallow features are plated in the second electroplating solution to a target height. In some embodiments the plating rate when the substrate is in the second electroplating solution is faster than the plating rate in the first electroplating solution after the leveler has deactivated the accelerator adsorbed into the bottom surface of the shallow and deep features. In some embodiments, operations 520 and 550 are performed in different chambers, which may on the same electroplating tool. In other embodiments, both plating operations are performed in the same chamber, but different plating baths are flowed into the chamber at different times.

In the process diagram of FIG. 6, operations 600-660 are substantially similar to operations 200-260, respectively as described above. The process diagram of FIG. 6 is different from the process diagram of FIG. 2 in that operations 600-620 may be repeated one or more times. Thus, in operation 620, where leveler has diffused to the bottom of the deep features and deactivated the accelerator, rather than continuing to plate at a lower rate due to the higher polarization caused by levelers and suppressors, the substrate may be rinsed and immersed in the same or another pre-acceleration solution to adsorb accelerator on the bottom surface of recessed features. Operations 610-620 be repeated to continue providing a differential plating rate between deep and shallow features of the substrate.

This may be desirable when the top portion of metal deposited in deep and shallow features is not co-planar before leveler deactivates the bottom surface of the deep features. Once leveler has deactivated the accelerator adsorbed into the bottom surface of the deep features, the plating rate of the shallow features and the deep features will be similar, and any difference in height of the top portion will be maintained. By repeating the adsorption of accelerator and the diffusion limited deactivation of deep and shallow features, co-planarity may be further improved.

Mass Transfer Mechanism of Action

Figure 7B:
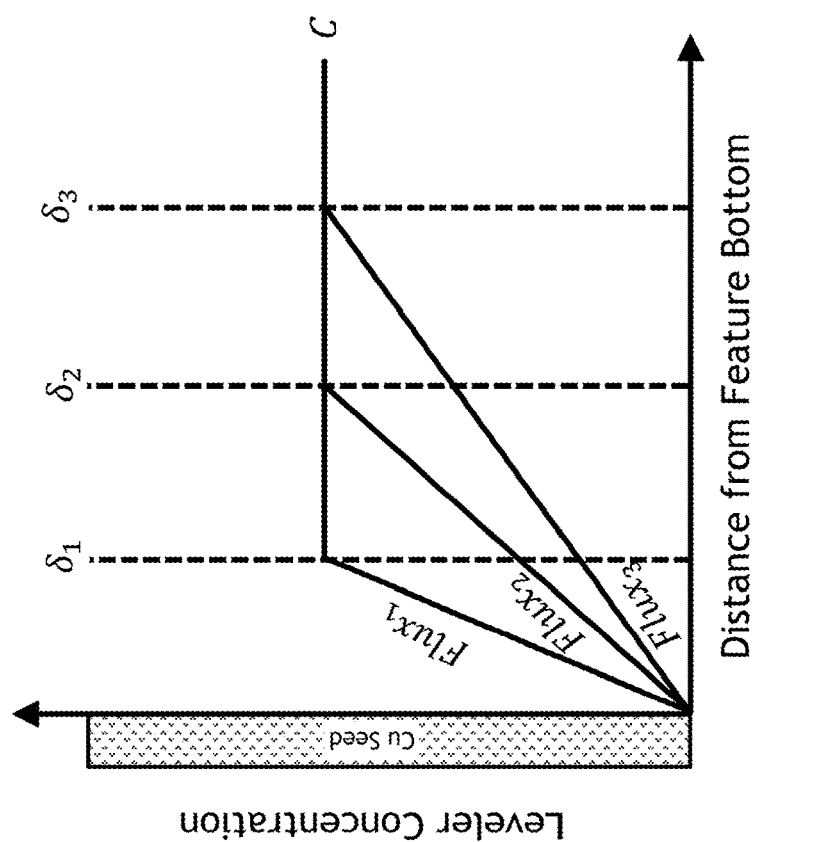
FIGS. 7A and 7B presents graphs of boundary layer conditions that may be present in various embodiments.
Figure 7A:
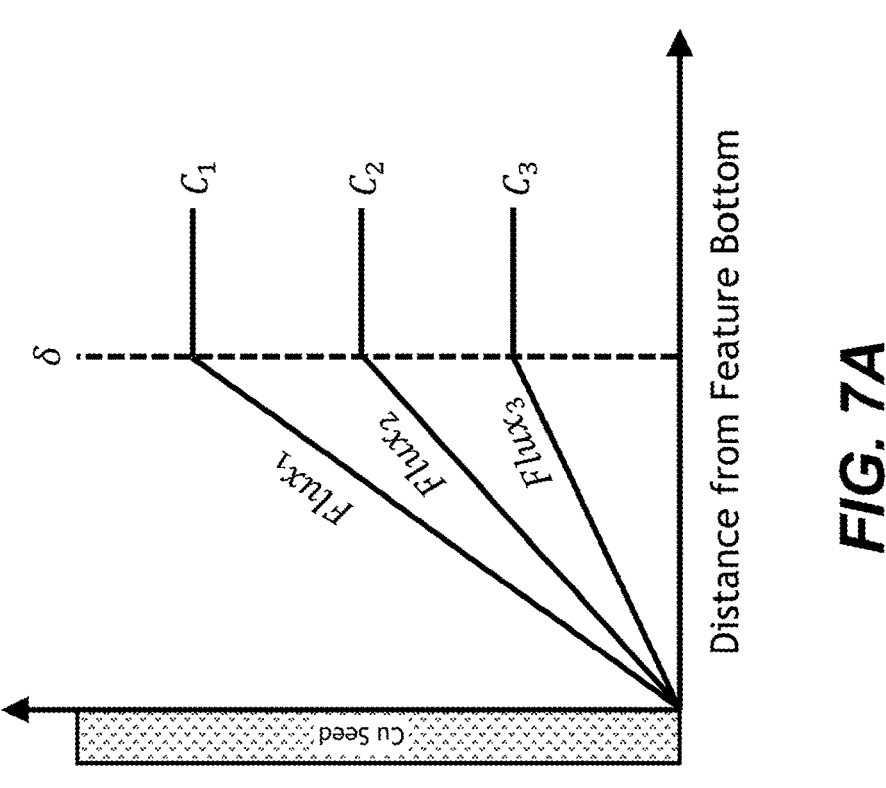

FIGS. 7A and 7B illustrate basic properties of leveler transport into recessed features of PR as described herein. Leveler transport may be generally modelled by Fick's First Law of Diffusion:

$$J_L = -D_L \frac{dC_L}{\delta} \qquad \text{(Eq. 1)}$$

In Eq. 1 shown above, differential $$\frac{dC_L}{\delta}$$

indicates change in leveler concentration per unit distance, $D_L$ is a constant diffusion coefficient, or diffusivity, with respect to a location within a feature, and $J_L$ is the "diffusion flux," of which the dimension is the amount of substance, e.g. leveler, per unit time per unit area. Diffusion flux may be expressed in such units as mol m$^{-2}$s$^{-1}$.

Leveler transport is described in the plot shown in FIG. 7A as a function of distance from feature bottom (i.e., height). At a distance $\delta$ from the feature bottom is the bulk solution, which has a nominally uniform concentration. The distance $\delta$, over which the leveler concentration changes, spans the boundary layer. As the concentration of leveler in the bulk solution decreases, the flux near the feature bottom decreases. Furthermore, the surface concentration of leveler is very close to zero during deactivation of the accelerator by the leveler. Thus, the displacement reaction is very fast relative to the diffusion process and the diffusion process is the rate-limiting step. Hence, the concentrations difference across the boundary layer may remain relatively constant over the course of the electroplating process.

Leveler transport is also described in FIG. 7B, where the bulk solution boundary layer is altered while concentration of leveler in the bulk solution remains the same. As illustrated and as understood by the ratio in Fick's law, the larger the boundary layer, the lower the flux. In other words, the leveler flux is greater in shallower features (which have a thin boundary layer) than in deep features (which have a thicker boundary layer). In some embodiments the thickness of the boundary layer is controlled by controlling convection characteristics of the electrolyte during an electroplating operation. Generally, the higher the velocity and/or turbulence of the solution at the features, the thinner the boundary layer, thereby increasing the flux of leveler to diffuse to the feature bottoms. Conversely, relatively lower local velocity and/or turbulence of the bulk solution reduce the flux of leveler, as the boundary layer is thicker.

In some embodiments, a boundary layer at the bottom of a feature may have a thickness of less than about 50 µm, or a thickness between about 5 and 50 µm. In some embodiments, the velocity of the solution above the substrate surface may vary between about 0.1 and 1.0 m/s. The solution flow may also be a laminar flow or a combination of laminar and turbulent flow. Flow circulation within features may vary between about 0.1 to 1.0 mm/sec as predicted by a fluid dynamics model. In some embodiments the boundary layer is thinner in shallow features than deep features, reducing the electroplating rate in shallow features compared to deep features.

Compositions

Pie-Acceleration Solution

Embodiments disclosed herein for differential plating of deep and shallow recessed features of a substrate involve adsorbing accelerator into the bottom surface of the recessed features prior to electroplating. Adsorbing accelerator may be accomplished by contacting the substrate with free accelerator (or other activating agent) under conditions allowing the accelerator to adsorb onto the surface. This may involve exposure by a simple spraying, immersion, or spin on technique for a short period of time. In some embodiments, the accelerator will adsorb into a metal seed layer on the bottom surface of the recessed features without adsorbing, or with minimal adsorption, into a non-conductive PR or mask layer that is patterned to define the recessed features.

A variety of pre-acceleration solutions may be used to provide accelerator for the pre-acceleration process. An example of a pre-acceleration solution for plating copper is a is solution containing between about 0.05 and 10 accelerator compound. in some embodiments accelerator compound concentration may be at least 10 ppm or at least 10,000 ppm. In some embodiments, a pre-acceleration solution may comprise mercapto and/or dimercapto hydrocarbon sulphonic acid compounds in deionized water. In some embodiments, pre-acceleration solution may comprise mercaptopropane sulfonic acid, dimercaptopropane sulfonic acid, mercaptoethane sulfonic acid, dimercaptoethane sulfonic acid, and/or bis-(3-sulfopropyl)-disulfide, In some embodiments, accelerator is adsorbed into recessed features as well as exposed field regions, and a selective removal step is performed to remove the accelerator from the exposed field regions. In some embodiments an accelerator precursor is adsorbed into the recessed features and then treated to activate the surface and decrease the polarization. Techniques and compositions for adsorbing accelerator into recessed features of a substrate may be found in U.S. Pat. No. 7,449,098 (Mayer et al.) issued Nov. 11, 2008, which is hereby incorporated by reference in relevant part.

Electroplating Solution

In some embodiments the electroplating solution may have a concentration level of about 85 grams per liter (g/l) of copper ions (Cu) provided by, for example, copper sulfate (CuSO$_4$). Generally, higher electroplating rates consume copper at a correspondingly high rate, thus a high copper concentration must be used to enable a high limiting deposition, or plating, rate. The electroplating solution may also have a concentration of 145 g/l of acid, e.g. sulfuric acid. A high acid concentration increases the conductivity of the first electroplating bath, which will reduce WIW and MD non-uniformity. For electroplating baths made of copper sulfate in solution with sulfuric acid, 145 g/l of acid is the highest acceptable concentration level of acid fur 100 g/l of copper ions at a temperature of approximately 45° C., without causing copper to form copper sulfate crystals that precipitate out of solution. In some embodiments the electroplating has a temperature between about 25 and 35° C. In some embodiments, a ratio of Cu to acid (in g/l:g/l) may be at least about 32:180, between about 50:100 and 40:140, or between about 60:80 and 55:150. In other embodiments, a different metal is plated into the recessed features.

Electroplating solutions as may be used in embodiments disclosed herein contain suppressor and leveler molecules, in addition to metal ions and one or more acids. In some embodiments the electroplating solution may also contain accelerator compounds at a low concentration, e.g., less than about 1 ppm. In some embodiments having accelerator in the electroplating solution counteracts the effect of the diffusion limited leveler transport into features. Suppressors are generally (but not always) present at an "excess" concentration, which may be at least 100 ppm. Examples of suppressors in the electroplating solution include polyethylene glycols, polyethylene oxides, polypropylene glycols, and/or polypropylene oxides. Accelerator that has been previously adsorbed into the recessed features inhibits the suppressors interaction with surfaces within the recessed features. Once leveler has deactivated the accelerator, suppressors can adsorb and slow down deposition. Thus, in some embodiments the concentration and mass transport limitations of leveler in the electroplating solution has the largest effect on plating rate.

Leveler may be present in the solution at low concentrations, or concentrations less than a few ppm (parts per million) in a copper plating bath. In some embodiments leveler concentration may be between about 0.1 and 50 ppm, between about 1 and 25 ppm, or between about 5 and 25 ppm. The concentration of leveler may vary depending on the particular compound used. In some embodiments, there is a sufficiently low concentration of leveler such that there is a substantial time delay, e.g. at least about 1, 5, 10, 15, or 20 minutes between when leveler deactivates accelerator in the bottom of shallow features and when leveler deactivates accelerator in the bottom of deep features. In some embodiments, leveler present in the electroplating solution may include: polyethylenimines, polyamidoamines, dialkylamines, trialkylamines, arylalkylamines, triazoles, imidazoles, tetrazoles, benzimidazoles, benzotriazoles, piperidine, morpholine, piperazine, pyridine, oxazole, benzoxazole, pyrimidine, quonoline, isoquinoline, and/or epihalohydrins. Leveling compounds are further discussed and described in US Patent Publication No. 2009/0139873, which is herein incorporated by reference in its entirety.

In some embodiments, the leveler used herein is identifiable by its electrochemical response in a test. By measuring the electrochemical response (e.g., voltammetric/polarographic responses) and characterizing it against a set of standards or a model, the suitability of the compound as an accelerator deactivating leveler can be determined. Various techniques may be employed to identify suitable leveler compounds. In some cases, the relation is performed automatically. For example, the model may take the form of a simple threshold electrochemical response, that when exceeded indicates the presence of a suitable leveler.

The electrochemical response (as an independent variable) may be properly measured and characterized by various techniques. Two basic illustrative methods for measuring the electrochemical response include (1) plating at a constant current and monitoring the potential at the electrode, and (2) plating at a constant potential and monitoring the current supplied to the electrode or the current density at the electrode or in solution. In some embodiments, the techniques include an electrode that is a rotating disk electrode. Techniques for measuring and threshold values for the electrochemical response of levelers is further described in U.S. Pat. No. 9,309,604 (Mayer et. al), which is hereby incorporated for such relevant purposes.

In some embodiments, the electrochemical response of leveler may be determined by a process as follows: (1) obtaining a rotating disc surface that is composed of copper and free of surface impurities, for example, by plating copper onto a platinum rotating disk electrode from an additive free solution of copper sulfate and sulfuric acid, (2) after (1), saturating the surface of a rotating disk electrode with accelerator of the type used in the produce WLP fill process, for example, by exposing the surface to a freshly made solution of 100 ppm of methane sulphonic acid in water also containing 1 g/L solution of sulfuric acid, (3) calibrating the test by identifying a baseline electrochemical response of suitable accelerator deactivating levelers in a plating solution while applying a cathodic potential the rotating disk electrode, (4) repeating the process of preparing a fresh pre-accelerated rotating disk electrode as in (1), and exposing it to a solution containing a test leveler while applying the test cathodic potential, and (5) determining whether the test leveler induces the baseline electrochemical response. The response can also be calibrated to measure the concentration of leveler in the solution by performing a series of test with different level concentration, and correlating an unknown response to the test series responses.

Apparatus

Figure 8:
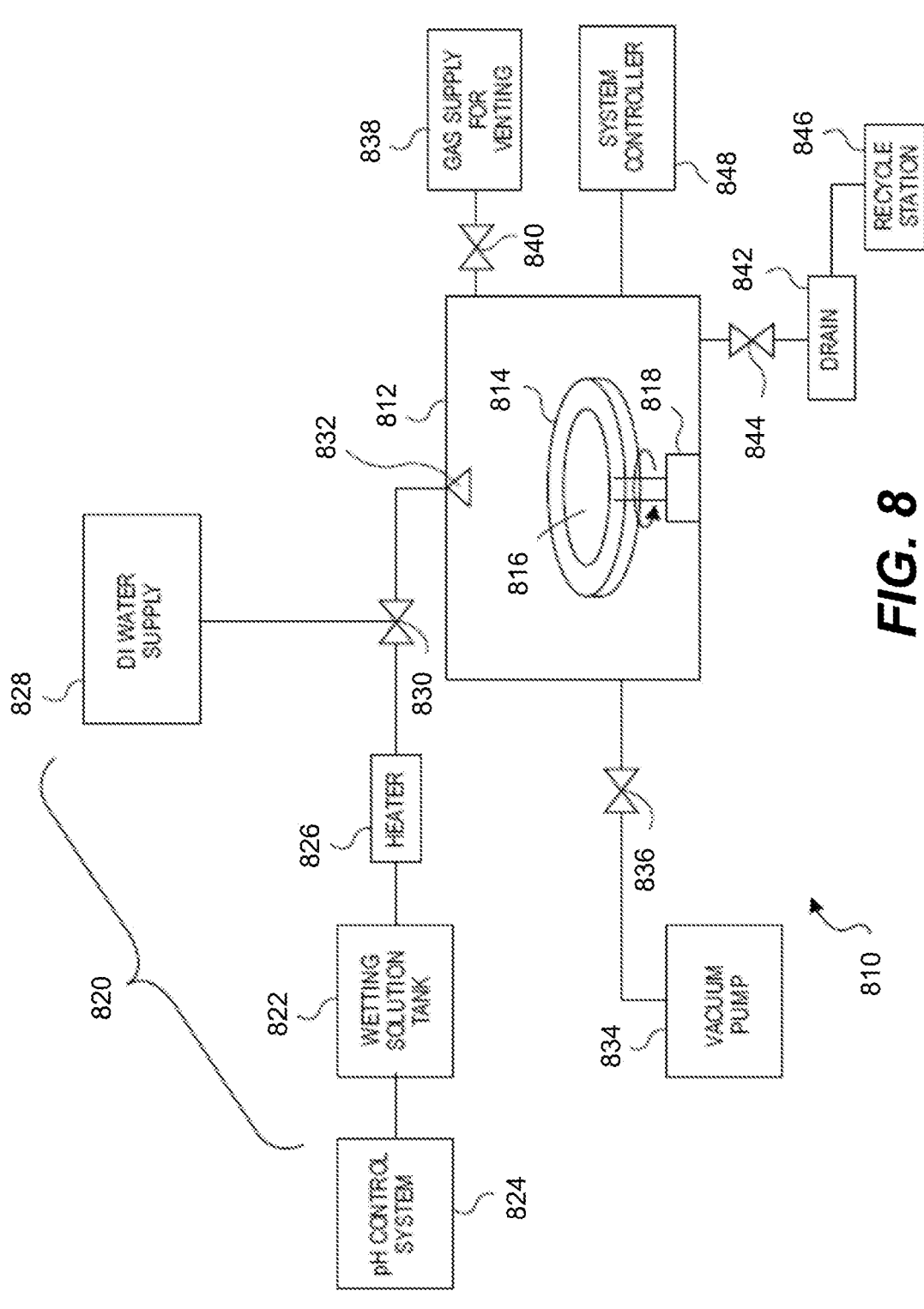

FIG. 8 depicts an embodiment of a pre-wetting chamber configured for saturating a structure with pre-acceleration solution. In a non-exclusive embodiment, the wetting tool 810 may be used for wetting of semiconductor substrates with pre-acceleration solution prior to plating.

The wetting tool 810 includes a chamber 812, a substrate pedestal 814 for supporting a substrate 816, such as a semiconductor wafer, and a mechanism 818 for rotating the substrate pedestal 814 and substrate 816. In one embodiment, the mechanism 818 is capable of rotating the substrate pedestal 814 and substrate 816 in the range of 80 to 200 revolutions per minute (rpm). But in other embodiments, other rpm values or ranges may be used. For example, rpm values of 40, 30, 20 or less can be used at the low end of a range and rpm values of 200, 300, 400 or higher can be used at the high end of the range. It should be noted that although specific RPM values and/or ranges may be provided herein, any suitable rpm value or range may be used. As such, the specific values or ranges provided herein are merely exemplary and should not be construed as limiting.

The wetting tool 810 also includes a wetting solution distribution system 820 which includes one or more wetting solution(s) tank(s) 822 for storing one or more wetting solutions, a pH control system 824 for measuring and adjusting the pH of the one or more wetting solution(s) stored in the tank(s) 822, a heater 826 for selectively heating the wetting solution(s), a deionized (DI) water supply 828, a three way valve 830 and a spray nozzle 832 provided inside the chamber 812.

The wetting solution(s) maintained in tank(s) 822 may include pre-acceleration solution as described herein as well as one or more of the following: (a) an inorganic acid, (b) an organic acid, (c) a dissolved gas in water, (d) dissolved carbon dioxide in water, (e) DI water, (f) DI and degassed water, (g) carbonic acid, (h) sulfuric acid, and (i) methane sufonic acid.

The pH control system 824 is arranged to monitor the pH of the solution(s) maintained in the tank(s). In various embodiments, the pH control system 824 may rely on a pH probe, a conductivity meter, a density meter, or a combination thereof to measure the composition of the wetting solution(s). In various embodiments, the pH of at least one wetting solution is maintained at 2.0 or less, In other embodiments, one wetting solution may have a pH of 2.0 or less, while a second wetting solution has a pH of 2.0 or more. The pH of the wetting solutions can be adjusted by the pH control system 824 as needed by acid dosing if the pH needs to be lowered, base dosing if the pH needs to be raised higher, by adding DI water (which typically has a pH of slightly less than neutral or 7.0) if the pH needs to be raised or lowered, or by gas dosing to either increase or decrease the pH. For example, carbon dioxide gas can be used to reduce the pH of the wetting solution(s).

The heater 826 can be any type of heater capable of heating the one or more wetting solutions maintained in the storage tank(s) 822. In various non-exclusive embodiments, the heater 826 is capable of heating the one or more wetting solution(s) in the temperature range of 20 to 50° C.

The three way valve 830 can be selectively opened and closed to supply the one or more wetting solution(s) maintained in the storage tank(s) 822 and/or DI water from supply 828 to the spray nozzle 832. In an alternative embodiment, the valve 830 can controlled to simultaneously supply both the wetting solution(s) and DI water to spray nozzle 832.

The spray nozzle 832 is depicted as positioned at the top of the chamber 812 for spraying wetting solutions and/or DI water directly down onto the top surface of substrate 816. In other embodiments, the spray nozzle 832 can be positioned on or adjacent a side wall of the chamber 812 and/or multiple spray nozzles 832 (not shown) may be provided at different positions within the chamber 812. Regardless of the number and/or positions of the spray nozzles 832, the purpose is to supply the wetting solution(s) and/or DI water onto the top surface of the substrate 816 while spinning on the pedestal 818. In yet other non-exclusive embodiments, the spray nozzles 832 may supply wetting solution(s) and/or DI water at a rate of 0.6 to 2.4 liters per minute.

The wetting tool 810 also optionally includes a vacuum pump 836 and a valve 836. When the valve 836 is opened and the pump 834 is operational, a vacuum pressure is created inside the chamber 812. In various non-exclusive embodiments, the vacuum pressure may range from 25 to 100 Torr and have a set-point of approximately 70 Torr. It should be understood that these Torr values/ranges are merely exemplary and that others may be used. In yet other embodiments, the wetting tool 810 may not include the vacuum pump 836. In which case, the chamber 812 is maintained at or near atmosphere.

The wetting tool 810 further includes a venting gas supply 838 and a valve 840. When the valve 840 is opened, gas from the supply 838 is vented into the chamber 812. In various embodiments, the gas is nitrogen, argon, and/or atmosphere. In yet other embodiments, the vented pressure within the chamber 812 ranges from 740 to 760 Torr.

The wetting tool 810 also includes a drain 842, a drain valve 844 and optionally a recycle station 846. When the valve 844 is opened, wetting solution and/or DI water in the chamber 812 is removed via the drain 842. In optional embodiments, the recycle station 846 may be used to clean and filter the drained wetting solution and/or DI water so it can be reused.

The system controller 848 is employed to control operation of the wetting tool 810 prior to, during, and post wetting of substrates 816. The system controller 848 controls the various elements, such as the pH control system 824, heater 826, vacuum pump 834, and valves 830, 836, 840 and 844 to coordinate the wetting of substrates 816 in accordance with various embodiments, as described in more detail below.

The system controller 848 typically includes one or non-transient computer readable medium devices for storing system control software or code computer and one or more processors for executing the code. The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. The processor may include a CPU or computer, multiple CPUs or computers, analog and/or digital input/output connections, motor controller boards, etc.

In certain embodiments, the system controller 848, running or executing the system control software or code, manages all or at least most of the activities of the tool 810, including such activities as controlling the timing of wetting operations, flow rates, pH levels and/or temperature of the wetting solution(s) and/or DI water, pressure levels inside the process chamber 812, the introduction and removal of substrates 816 into the chamber 812, etc.

The system controller 848 may also include a user interface (not shown). The user interface may include a display screen, graphical software displays of indicative of operating parameters and/or process conditions of the tool 810, and user input devices that allow a human operator to interface with the tool 810, such as pointing devices, keyboards, touch screens, microphones, etc.

Figure 9:
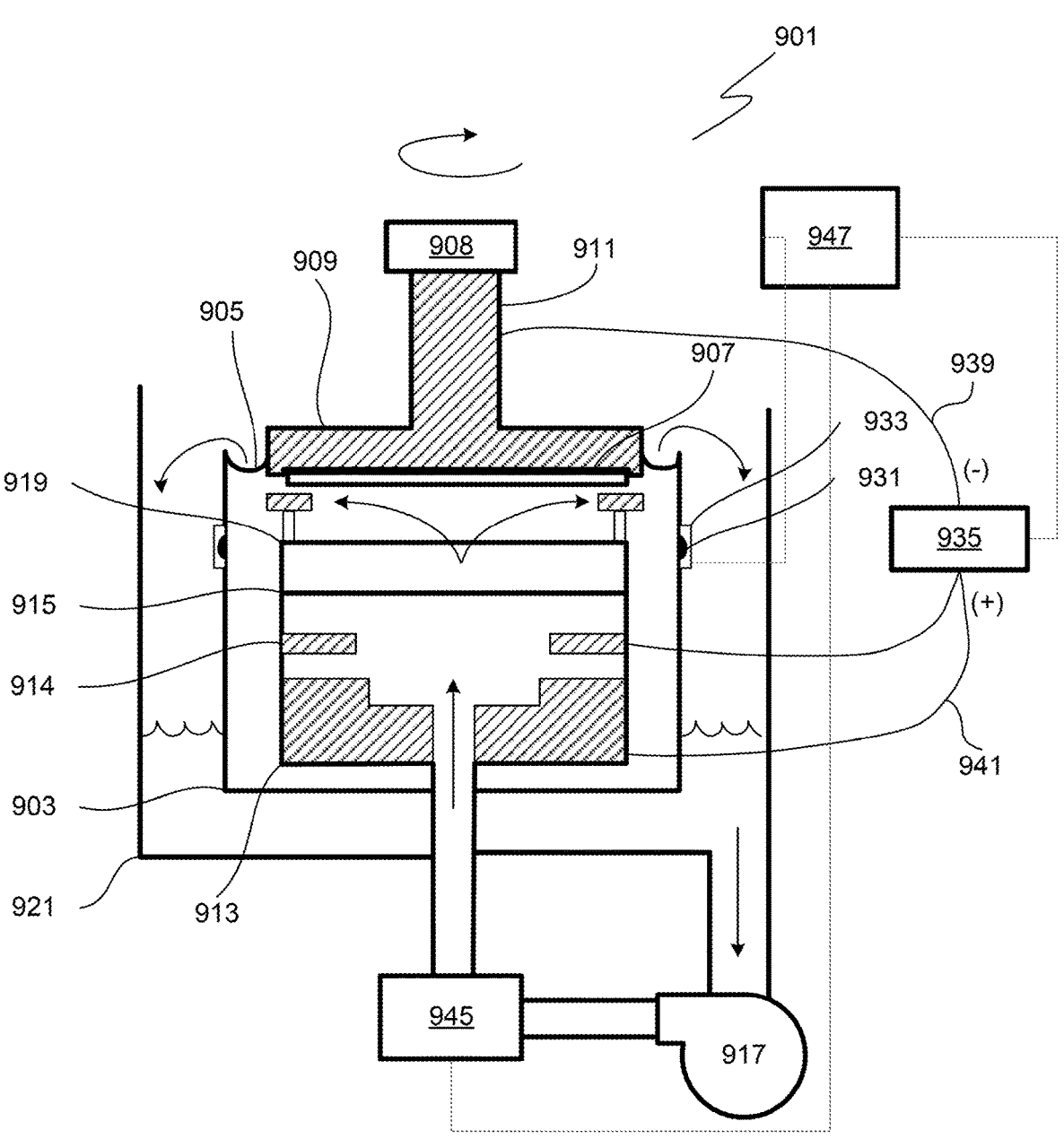

FIG. 9 presents an example of an electroplating cell in which electroplating may occur. Often, an electroplating apparatus includes one or more electroplating cells in which the substrates (e.g., wafers) are processed. Only one electroplating cell is shown in FIG. 9 to preserve clarity. To optimize bottom-up electroplating, additives (e.g., accelerators, suppressors, and levelers) are added to the electrolyte; however, an electrolyte with additives may react with the anode in undesirable ways. Therefore anodic and cathodic regions of the plating cell are sometimes separated by a membrane so that plating solutions of different composition may be used in each region. Plating solution in the cathodic region is called catholyte; and in the anodic region, anolyte. A number of engineering designs can be used in order to introduce anolyte and catholyte into the plating apparatus. In embodiments discussed herein using multiple plating solutions, such as the process diagram of FIG. 5, one electroplating cell may be used to with one plating solution, while a different electroplating cell is used for a different electroplating solution.

Referring to FIG. 9, a diagrammatical cross-sectional view of an electroplating apparatus 901 in accordance with one embodiment is shown. The plating bath 903 contains the plating solution (having a composition as provided herein), which is shown at a level 905. The catholyte portion of this vessel is adapted for receiving substrates in a catholyte. A wafer 907 is immersed into the plating solution and is held by, e.g., a "clamshell" substrate holder 909, mounted on a rotatable spindle 911, which allows rotation of clamshell substrate holder 909 together with the wafer 907. A general description of a clamshell-type plating apparatus having aspects suitable for use with this invention is described in detail in U.S. Pat. No. 6,156,167 issued to Patton et al., and U.S. Pat. No. 6,800,187 issued to Reid et al., which are incorporated herein by reference in their entireties.

An anode 913 is disposed below the wafer within the plating bath 903 and is separated from the wafer region by a membrane 915, preferably an ion selective membrane. For example, Nafion™ cationic exchange membrane (CEM) may be used. The region below the anodic membrane is often referred to as an "anode chamber." The ion-selective anode membrane 915 allows ionic communication between the anodic and cathodic regions of the plating cell, while preventing the particles generated at the anode from entering the proximity of the wafer and contaminating it. The anode membrane is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated herein by reference in their entireties. Ion exchange membranes, such as cationic exchange membranes, are especially suitable for these applications. These membranes are typically made of ionomeric materials, such as perfluorinated co-polymers containing sulfonic groups (e.g. Nafion™), sulfonated polyimides, and other materials known to those of skill in the art to be suitable for cation exchange. Selected examples of suitable Nafion™ membranes include N324 and N424 membranes available from Dupont de Nemours Co.

During plating the ions from the plating solution are deposited on the substrate. The metal ions must diffuse through the diffusion boundary layer and into the TSV hole or other feature. A typical way to assist the diffusion is through convection flow of the electroplating solution provided by the pump 917. Additionally, a vibration agitation or sonic agitation member may be used as well as wafer rotation. For example, a vibration transducer 908 may be attached to the clamshell substrate holder 909.

The plating solution is continuously provided to plating bath 903 by the pump 917. Generally, the plating solution flows upwards through an anode membrane 915 and a diffuser plate 919 to the center of wafer 907 and then radially outward and across wafer 907. The plating solution also may be provided into the anodic region of the bath from the side of the plating bath 903. The plating solution then overflows plating bath 903 to an overflow reservoir 921. The plating solution is then filtered (not shown) and returned to pump 917 completing the recirculation of the plating solution. In certain configurations of the plating cell, a distinct electrolyte is circulated through the portion of the plating cell in which the anode is contained while mixing with the main plating solution is prevented using sparingly permeable membranes or ion selective membranes.

A reference electrode 931 is located on the outside of the plating bath 903 in a separate chamber 933, which chamber is replenished by overflow from the main plating bath 903. Alternatively, in some embodiments the reference electrode is positioned as close to the substrate surface as possible, and the reference electrode chamber is connected via a capillary tube or by another method, to the side of the wafer substrate or directly under the wafer substrate. In some of the preferred embodiments, the apparatus further includes contact sense leads that connect to the wafer periphery and which are configured to sense the potential of the metal seed layer at the periphery of the wafer but do not carry any current to the wafer.

A reference electrode 931 is typically employed when electroplating at a controlled potential is desired. The reference electrode 931 may be one of a variety of commonly used types such as mercury/mercury sulfate, silver chloride, saturated calomel, or copper metal. A contact sense lead in direct contact with the wafer 907 may be used in some embodiments, in addition to the reference electrode, for more accurate potential measurement (not shown).

A DC power supply 935 can be used to control current flow to the wafer 907. The power supply 935 has a negative output lead 939 electrically connected to wafer 907 through one or more slip rings, brushes and contacts (not shown). The positive output lead 941 of power supply 935 is electrically connected to an anode 913 located in plating bath 903. The power supply 935, a reference electrode 931, and a contact sense lead (not shown) can be connected to a system controller 947, which allows, among other functions, modulation of current and potential provided to the elements of electroplating cell. For example, the controller may allow electroplating in potential-controlled and current-controlled regimes. The controller may include program instructions specifying current and voltage levels that need to be applied to various elements of the plating cell, as well as times at which these levels need to be changed. When forward current is applied, the power supply 935 biases the wafer 907 to have a negative potential relative to anode 913. This causes an electrical current to flow from anode 913 to the wafer 907, and an electrochemical reduction (e.g. $Cu^{2+}+2 e^-=Cu^0$) occurs on the wafer surface (the cathode), which results in the deposition of the electrically conductive layer (e.g. copper) on the surfaces of the wafer. An inert anode 914 may be installed below the wafer 907 within the plating bath 903 and separated from the wafer region by the membrane 915.

The apparatus may also include a heater 945 for maintaining the temperature of the plating solution at a specific level. The plating solution may be used to transfer the heat to the other elements of the plating bath. For example, when a wafer 907 is loaded into the plating bath the heater 945 and the pump 917 may be turned on to circulate the plating solution through the electroplating apparatus 901, until the temperature throughout the apparatus becomes substantially uniform. In one embodiment the heater is connected to the system controller 947. The system controller 947 may be connected to a thermocouple to receive feedback of the plating solution temperature within the electroplating apparatus and determine the need for additional heating.

The controller will typically include one or more memory devices and one or more processors. The processor may include a CPU or computer, analog and/or digital input/output connections, stepper motor controller boards, etc. In certain embodiments, the controller controls all of the activities of the electroplating apparatus. Non-transitory machine-readable media containing instructions for controlling process operations in accordance with the present embodiments may be coupled to the system controller.

Typically there will be a user interface associated with controller 947. The user interface may include a display screen, graphical software displays of the apparatus and/or process conditions, and user input devices such as pointing devices, keyboards, touch screens, microphones, etc. The computer program code for controlling electroplating processes can be written in any conventional computer readable programming language: for example, assembly language, C, C++, Pascal, Fortran or others. Compiled object code or script is executed by the processor to perform the tasks identified in the program. One example of a plating apparatus that may be used according to the embodiments herein is the Lam Research Sabre tool. Electrodeposition can be performed in components that form a larger electrodeposition apparatus.

Figure 10:
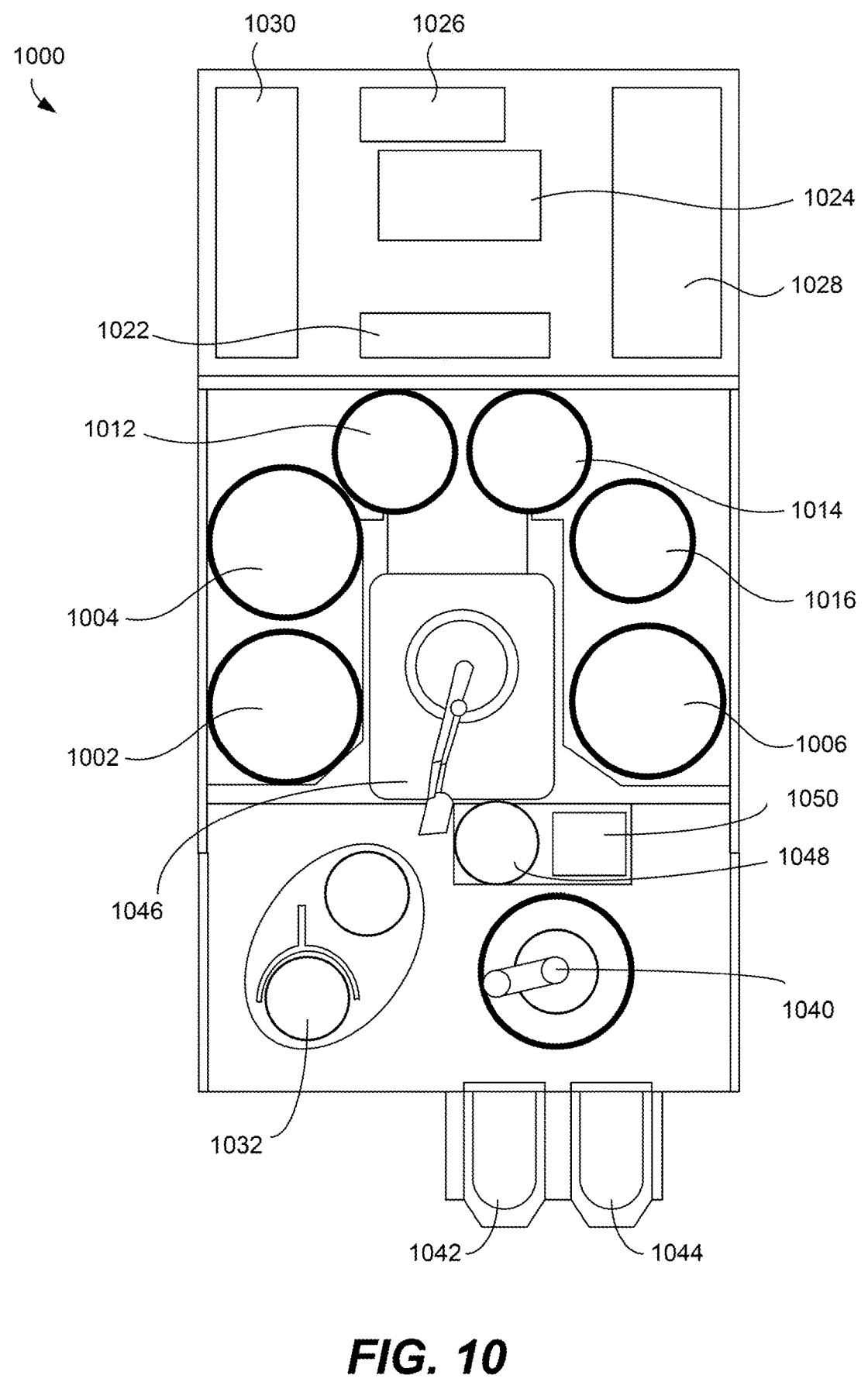

FIG. 10 shows a schematic of a top view of an example electrodeposition apparatus. The electrodeposition apparatus 1000 can include three separate electroplating modules 1002, 1004, and 1006. The electrodeposition apparatus 1000 can also include three separate modules 1012, 1014, and 1016 configured for various process operations. For example, in sonic embodiments, one or more of modules 1012, 1014, and 1016 may be a spin rinse drying (SRD) module. In other embodiments, one or more of the modules 1012, 1014, and 1016 may be post-electrofill modules (PEMs), each configured to perform a function, such as edge bevel removal, backside etching, and acid cleaning of substrates after they have been processed by one of the electroplating modules 1002, 1004, and 1006.

The electrodeposition apparatus 1000 includes a central electrodeposition chamber 1024. The central electrodeposition chamber 1024 is a chamber that holds the chemical solution used as the electroplating solution in the electroplating modules 1002, 1004, and 1006. The electrodeposition apparatus 1000 also includes a dosing system 1026 that may store and deliver additives for the electroplating solution. A chemical dilution module 1022 may store and mix chemicals to be used as an etchant. A filtration and pumping unit 1028 may filter the electroplating solution for the centra electrodeposition chamber 1024 and pump it to the electroplating modules.

A system controller 1030 provides electronic and interface controls required to operate the electrodeposition apparatus 1000. The system controller 1030 (which may include one or more physical or logical controllers) controls some or all of the properties of the electroplating apparatus 1000.

Signals for monitoring the process may be provided by analog and/or digital input connections of the system controller 1030 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

A hand-off tool 1040 may select a substrate from a substrate cassette such as the cassette 1042 or the cassette 1044. The cassettes 1042 or 1044 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 1040 may hold the substrate using a vacuum attachment or some other attaching mechanism.

The hand-off tool 1040 may interface with a wafer handling station 1032, the cassettes 1042 or 1044, a transfer station 1050, or an aligner 1048. From the transfer station 1050, a hand-off tool 1046 may gain access to the substrate. The transfer station 1050 may be a slot or a position from and to which hand-off tools 1040 and 1046 may pass substrates without going through the aligner 1048. In some embodiments, however, to ensure that a substrate is properly aligned on the hand-off tool 1046 for precision delivery to an electroplating module, the hand-off tool 1046 may align the substrate with an aligner 1048. The hand-off tool 1046 may also deliver a substrate to one of the electroplating modules 1002, 1004, or 1006 or to one of the three separate modules 1012, 1014, and 1016 configured for various process operations.

An example of a process operation according to the methods described above may proceed as follows: (1) electrodeposit copper or another material onto a substrate in the electroplating module 1004; (2) rinse and dry the substrate in SRD in module 1012; and, (3) perform edge bevel removal in module 1014.

An apparatus configured to allow efficient cycling of substrates through sequential plating, rinsing, drying, and PEM process operations may be useful for implementations for use in a manufacturing environment. To accomplish this, the module 1012 can be configured as a spin rinse dryer and an edge bevel removal chamber. With such a module 1012, the substrate would only need to be transported between the electroplating module 1004 and the module 1012 for the copper plating and EBR operations. In some embodiments the methods described herein will be implemented in a system which comprises an electroplating apparatus and a stepper.

Figure 11:
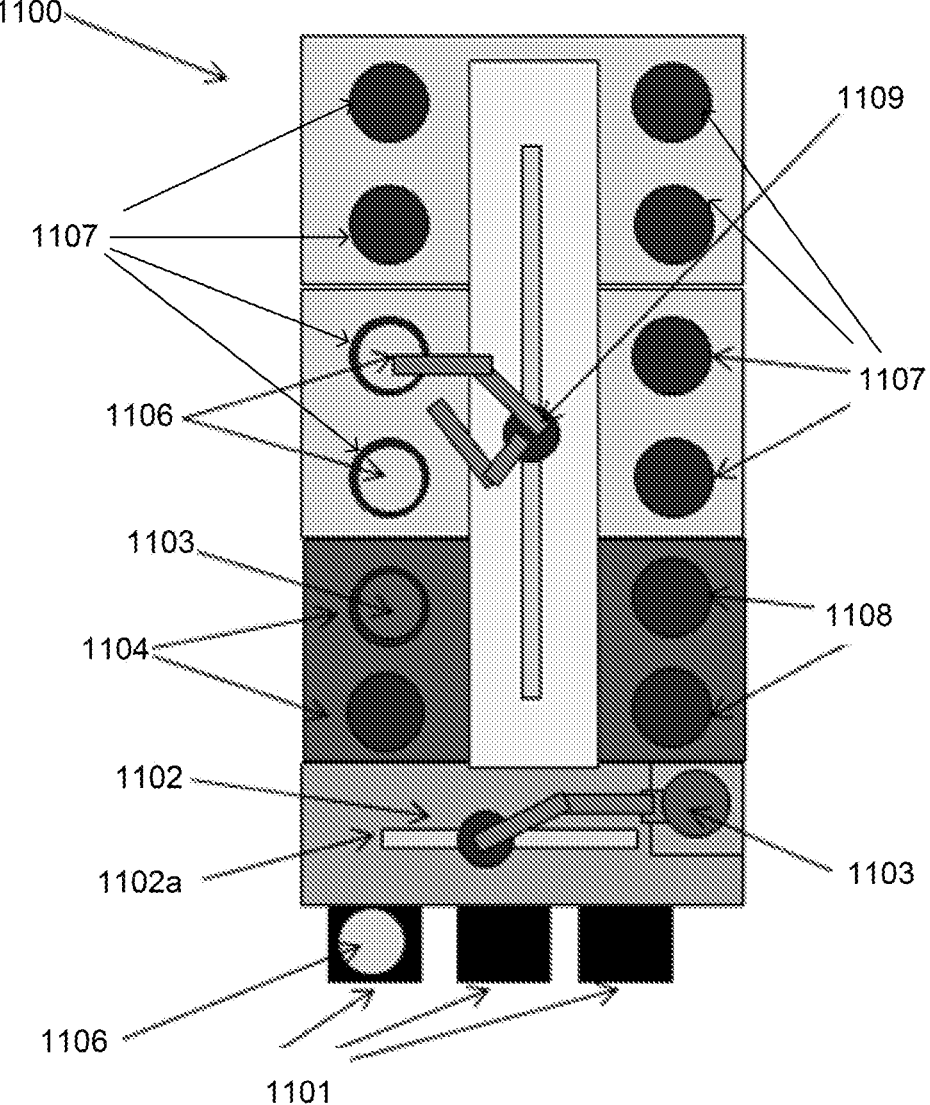

An alternative embodiment of an electrodeposition apparatus 1100 is schematically illustrated in FIG. 11. In this embodiment, the electrodeposition apparatus 1100 has a set of electroplating cells 1107, each containing an electroplating bath, in a paired or multiple "duet" configuration. In addition to electroplating per se, the electrodeposition apparatus 1100 may perform a variety of other electroplating related processes and sub-steps, such as spin-rinsing, spin-drying, metal and silicon wet etching, electroless deposition, pre-wetting and pre-chemical treating, reducing, annealing, electro-etching and/or electropolishing, photoresist stripping, and surface pre-activation with a pre-accelerator solution, for example. The electrodeposition apparatus 1100 is shown schematically looking top down in FIG. 11, and only a single level or "floor" is revealed in the figure, but it is to be readily understood by one having ordinary skill in the art that such an apparatus, e.g., the Lam Sabre™ 3D tool, can have two or more levels "stacked" on top of each other, each potentially having identical or different types of processing stations.

Referring once again to FIG. 11, the substrates 1106 that are to be electroplated are generally fed to the electrodeposition apparatus 1100 through a front end loading FOUP 1101 and, in this example, are brought from the FOUP to the main substrate processing area of the electrodeposition apparatus 1100 via a front-end robot 1102 that can retract and move a substrate 1106 driven by a spindle 1103 in multiple dimensions from one station to another of the accessible stations two front-end accessible stations 1104 and also two front-end accessible stations 1108 are shown in this example. The front-end accessible stations 1104 and 1108 may include, for example, pre-treatment stations, and spin rinse drying (SRD) stations. Lateral movement from side-to-side of the front-end robot 1102 is accomplished utilizing robot track 1102a. Each of the substrates 1106 may be held by a cup/cone assembly (not shown) driven by a spindle 1103 connected to a motor (not shown), and the motor may be attached to a mounting bracket 1109. Also shown in this example are the four "duets" of electroplating cells 1107, for a total of eight electroplating cells 1107. A system controller (not shown) may be coupled to the electrodeposition apparatus 1100 to control some or all of the properties of the electrodeposition apparatus 1100. The system controller may be programmed or otherwise configured to execute instructions according to processes described earlier herein.

System Controller

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CND) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 12:
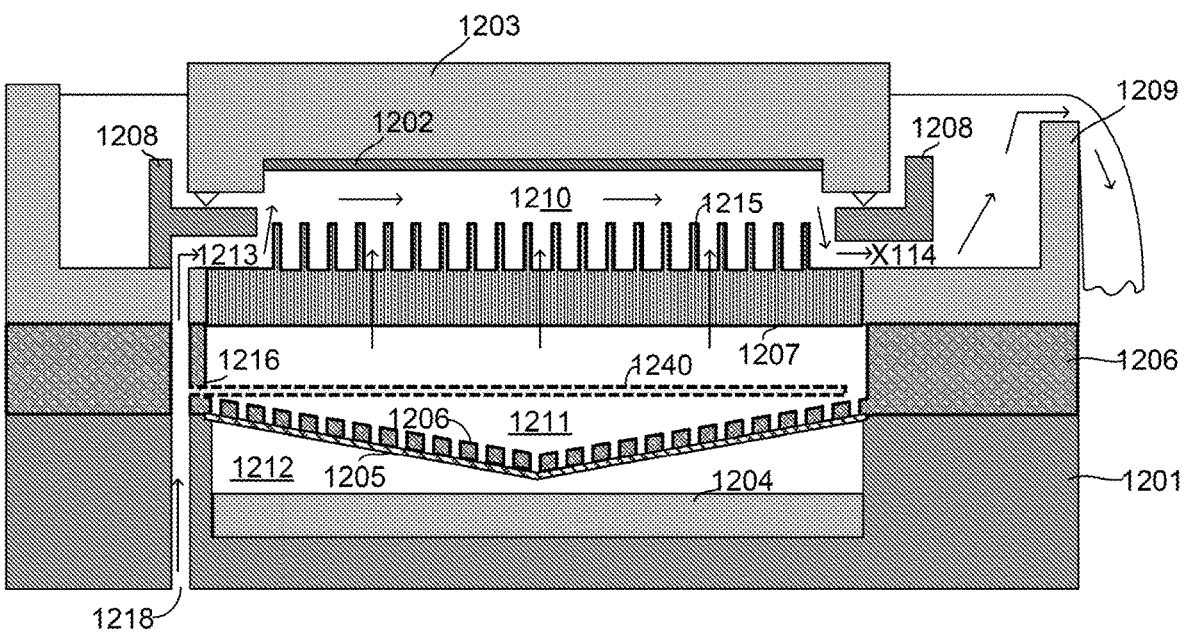

FIG. 12 depicts a simplified cross-sectional view of an electroplating apparatus. The apparatus includes an electroplating cell 1201, with substrate 1202 positioned in a substrate holder 1203. Substrate holder 1203 is often referred to as a cup, and it may support the substrate 1202 at its periphery. An anode 1204 is positioned near the bottom of the electroplating cell 1201. The anode 1204 is separated from the substrate 1202 by a membrane 1205, which is supported by a membrane frame 1206. Membrane frame 1206 is sometimes referred to as an anode chamber membrane frame, as it defines the top of the anode chamber housing the anode. Further, the anode 1204 is separated from the substrate 1202 by an ionically resistive element 1207. The ionically resistive element 1207 includes openings that allow electrolyte to travel through the ionically resistive element 1207 to impinge upon the substrate 1202. A front side insert 1208 is positioned above the ionically resistive element 1207, proximate the periphery of the substrate 1202. The front side insert 1208 may be ring-shaped, and may be azimuthally non-uniform, as shown. The front side insert 1208 is sometimes also referred to as a cross flow confinement ring.

An anode chamber 1212 is below the membrane 1205, and is where the anode 1204 is located. An ionically resistive element manifold 1211 is above the membrane 1205 and below the ionically resistive element 1207. An inlet 1216, which may be connected with an irrigation flute 1240, delivers catholyte to the ionically resistive element manifold 1211, and may act to irrigate the membrane 1205 during electroplating. In this example, the inlet 1216 and irrigation flute 1240 are fed by electrolyte that passes through catholyte inlet 1218. A cross flow manifold 1210 is above the ionically resistive element 1207 and below the substrate 1202. The height of the cross flow manifold is considered to be the distance between the substrate 1202 and the plane of the ionically resistive element 1207 (excluding the ribs 1215 on the upper surface of the ionically resistive element 1207, if present). In some cases, the cross flow manifold may have a height between about 1 mm-4 mm, or between about 0.5 mm-15 mm. The cross flow manifold 1210 is defined on its sides by the front side insert 1208, which acts to contain the cross flowing electrolyte within the cross flow manifold 1210. A side inlet 1213 to the cross flow manifold 1210 is provided azimuthally opposite a side outlet 1214 to the cross flow manifold 1210. The side inlet 1213 and side outlet 1214 may be formed, at least partially, by the front side insert 1208, As shown by the arrows in FIG. 12, electrolyte travels from the catholyte inlet 1218, through the side inlet 1213, into the cross flow manifold 1210, and out the side outlet 1214. In addition, electrolyte may travel through one or more inlets to the ionically resistive element manifold 1211 (e.g., inlets in irrigation flute 1240 and/or other inlets), into the ionically resistive element manifold 1211, through the openings in the ionically resistive element 1207, into the cross flow manifold 1210, and out the side outlet 1214. After passing through the side outlet 1214, the electrolyte spills over weir wall 1209. The electrolyte may be recovered and recycled.

In certain embodiments, the ionically resistive element 1207 approximates a nearly constant and uniform current source in the proximity of the substrate (cathode) and, as such, may be referred to as a high resistance virtual anode (HRVA) or channeled ionically resistive element (CIRP) in some contexts. Normally, the ionically resistive element 1207 is placed in close proximity with respect to the wafer. In contrast, an anode in the same close-proximity to the substrate would be significantly less apt to supply a nearly constant current to the wafer, but would merely support a constant potential plane at the anode metal surface, thereby allowing the current to be greatest where the net resistance from the anode plane to the terminus (e.g., to peripheral contact points on the wafer) is smaller. So while the ionically resistive element 1207 has been referred to as a high-resistance virtual anode (HRVA), this does not imply that electrochemically the two are interchangeable. Under certain operational conditions, the ionically resistive element 1207 would more closely approximate and perhaps be better described as a virtual uniform current source, with nearly constant current being sourced from across the upper plane of the ionically resistive element 1207.

The ionically resistive element 1207 contains micro size (typically less than 0.04") through-holes that are spatially and ionically isolated from each other and do not form interconnecting channels within the body of ionically resistive element, in many but not all implementations, Such through-holes are often referred to as non-communicating through-holes. They typically extend in one dimension, often, but not necessarily, normal to the plated surface of the wafer (in some embodiments the non-communicating holes are at an angle with respect to the wafer which is generally parallel to the ionically resistive element front surface). Often the through-holes are parallel to one another. Often the holes are arranged in a square array. Other times the layout is in an offset spiral pattern. These through-holes are distinct from 3-D porous networks, where the channels extend in three dimensions and form interconnecting pore structures, because the through-holes restructure both ionic current flow and (in certain cases) fluid flow parallel to the surface therein, and straighten the path of both current and fluid flow towards the wafer surface. However, in certain embodiments, such a porous plate, having an interconnected network of pores, may be used as the ionically resistive element. When the distance from the plate's top surface to the wafer is small (e.g., a gap of about 1/10 the size of the water radius, for example less than about 5 mm), divergence of both current flow and fluid flow is locally restricted, imparted and aligned with the ionically resistive element channels.

One example ionically resistive element 1207 is a disc made of a solid, non-porous dielectric material that is ionically and electrically resistive. The material is also chemically stable in the plating solution of use. In certain cases the ionically resistive element 1207 is made of a ceramic material (e.g., aluminum oxide, stannic oxide, titanium oxide, or mixtures of metal oxides) or a plastic material (e.g., polyethylene, polypropylene, polyvinylidene difluoride (PVDF), polytetrafluoroethylene, polysulphone, polyvinyl chloride (PVC), polycarbonate, and the like), having between about 6,000-12,000 non-communicating through-holes. The ionically resistive element 1207, in many embodiments, is substantially coextensive with the wafer (e.g., the ionically resistive element 1207 has a diameter of about 300 mm when used with a 300 mm wafer) and resides in close proximity to the wafer, e.g., just below the wafer in a wafer-facing-down electroplating apparatus. Preferably, the plated surface of the water resides within about 10 mm, more preferably within about 5 mm of the closest ionically resistive element surface. To this end, the top surface of the ionically resistive element 1207 may be flat or substantially flat. Often, both the top and bottom surfaces of the ionically resistive element 1207 are flat or substantially flat. In a number of embodiments, however, the top surface of the ionically resistive element 1207 includes a series of linear ribs, as described further below.

As above, the overall ionic and flow resistance of the plate 1207 is dependent on the thickness of the plate and both the overall porosity (fraction of area available for flow through the plate) and the size/diameter of the holes. Plates of lower porosities will have higher impinging flow velocities and ionic resistances. Comparing plates of the same porosity, one having smaller diameter 1-D holes (and therefore a larger number of 1-D holes) will have a more micro-uniform distribution of current on the wafer because there are more individual current sources, which act more as point sources that can spread over the same gap, and will also have a higher total pressure drop (high viscous flow resistance).

In some cases, about 1-10% of the ionically resistive element 1207 is open area through which ionic current can pass (and through which electrolyte can pass if there is no other element blocking the openings). In particular embodiments, about 2-5% the ionically resistive element 1207 is open area. In a specific example, the open area of the ionically resistive element 1207 is about 3.2% and the effective total open cross sectional area is about 23 cm$^2$. In some embodiments, non-communicating holes formed in the ionically resistive element 1207 have a diameter of about 0.01 to 0.08 inches. In some cases, the holes have a diameter of about 0.02 to 0.03 inches, or between about 0.03-0.06 inches. in various embodiments the holes have a diameter that is at most about 0.2 times the gap distance between the ionically resistive element 1207 and the wafer. The holes are generally circular in cross section, but need not be. Further, to ease construction, all holes in the ionically resistive element 1207 may have the same diameter. However this need not be the case, and both the individual size and local density of holes may vary over the ionically resistive element surface as specific requirements may dictate.

The ionically resistive element 1207 shown in FIG. 12 includes a series of linear ribs 1215 that extend into/out of the page. The ribs 1215 are sometimes referred to as protuberances. The ribs 1215 are positioned on the top surface of the ionically resistive element 1207, and in many cases they are oriented such that their length (e.g., their longest dimension) is perpendicular to the direction of cross flowing electrolyte. In a particular embodiment, the ribs 1215 may be oriented such that their length is parallel to the direction of cross flowing electrolyte. The ribs 1215 affect the fluid flow and current distribution within the cross flow manifold 1210. For instance, the cross flow of electrolyte is largely confined to the area above the top surface of the ribs 1215, creating a high rate of electrolyte cross flow in this area. In the regions between adjacent ribs 1215, current delivered upward through the ionically resistive element 1207 is redistributed, becoming more uniform, before it is delivered to the substrate surface.

In FIG. 12, the direction of cross flowing electrolyte is left-to-right (e.g., from the side inlet 1213 to the side outlet 1214), and the ribs 1215 are oriented such that their lengths extend into/out of the page. In certain embodiments, the ribs 1215 may have a width (measured left-to-right in FIG. 12) between about 0.5 mm-1.5 mm, or between about 0.25 mm-10 mm. The ribs 1215 may have a height (measured up-down in FIG. 12) between about 1.5 mm-3.0 mm, or between about 0.25 mm-7.0 mm. The ribs 1215 may have a height to width aspect ratio (height/width) between about 5/1-2/1, or between about 7/1-1/7. The ribs 1215 may have a pitch between about 10 mm-30 mm, or between about 5 mm-150 mm. The ribs 1215 may have variable lengths (measured into/out of the page in FIG. 12) that extend across the face of the ionically resistive element 1207. The distance between the upper surface of the ribs 1215 and the surface of the substrate 1202 may be between about 1 mm-4 mm, or between about 0.5 mm-15 mm. The ribs 1215 may be provided over an area that is about coextensive with the substrate, as shown in FIG. 12. The channels/openings in the ionically resistive element 1207 may be positioned between adjacent ribs 1215, or they may extend through the ribs 1215 (in other words, the ribs 1215 may or may not be channeled). In some other embodiments, the ionically resistive element 1207 may have an upper surface that is flat (e.g., does not include the ribs 1215). The electroplating apparatus shown in FIG. 12, including the ionically resistive element with ribs thereon, is further discussed in U.S. Pat. No. 9,523,155, titled "ENHANCEMENT OF ELECTROLYTE HYDRO-DYNAMICS FOR EFFICIENT MASS TRANSFER DURING ELECTROPLATING," which is herein incorporated by reference in its entirety.

The apparatus may include various additional elements as needed for a particular application. In some cases, an edge flow element may be provided proximate the periphery of the substrate, within the cross flow manifold. The edge flow element may be shaped and positioned to promote a high degree of electrolyte flow (e.g., cross flow) near the edges of the substrate. The edge flow element may be ring-shaped or arc-shaped in certain embodiments, and may be azimuthally uniform or non-uniform. Edge flow elements are further discussed in U.S. patent application Ser. No. 14/924,124, filed Oct. 27, 2015, and titled "EDGE FLOW ELEMENT FOR ELECTROPLATING APPARATUS," which is herein incorporated by reference in its entirety.

In some cases, the apparatus may include a sealing member for temporarily sealing the cross flow manifold. The sealing member may be ring-shaped or arc-shaped, and may be positioned proximate the edges of the cross flow manifold. A ring-shaped sealing member may seal the entire cross flow manifold, while an arc-shaped sealing member may seal a portion of the cross flow manifold (in some cases leaving the side outlet open). During electroplating, the sealing member may be repeatedly engaged and disengaged to seal and unseal the cross flow manifold. The sealing member may be engaged and disengaged by moving the substrate holder, ionically resistive element, front side insert, or other portion of the apparatus that engages with the sealing member. Sealing members and methods of modulating cross flow are further discussed in the following U.S. Patent Applications, each of which is herein incorporated by reference in its entirety: U.S. patent application Ser. No. 15/225,716, filed Aug. 1, 2016, and titled "DYNAMIC MODULATION OF CROSS FLOW MANIFOLD DURING ELECTROPLATING"; and U.S. patent application Ser. No. 15/161,081, filed May 20, 2016, and titled "DYNAMIC MODULATION OF CROSS FLOW MANIFOLD DURING ELECTROPLATING."

In various embodiments, one or more electrolyte jet may be provided to deliver additional electrolyte above the ionically resistive element. The electrolyte jet may deliver electrolyte proximate a periphery of the substrate, or at a location that is closer to the center of the substrate, or both. The electrolyte jet may be oriented in any position, and may deliver cross flowing electrolyte, impinging electrolyte, or a combination thereof. Electrolyte jets are further described in U.S. patent application Ser. No. 15/455,011, filed Mar. 9, 2017, and titled "ELECTROPLATING APPARATUS AND METHODS UTILIZING INDEPENDENT CONTROL OF IMPINGING ELECTROLYTE," which is herein incorporated by reference in its entirety.

Applications

The processes described herein can be applied to fill through mask features during fabrication of a variety of packaging interconnects with features of various sizes, including copper wires, redistribution lines (RDL), and pillars of different sizes, critical dimensions, shapes, and layout density. Such pillars may include: micro-pillars, standard pillars and integrated high density fan-out (HDFO) and megapillars. The average feature depths may vary substantially, e.g. from about 20 to 70 μm, or about 50 μm. In some embodiments, a feature depth could be at least about 5 μm, such as for RDL, or about 270 μm, such as megapillars. The feature widths (or diameters in the case of substantially cylindrically-shaped features) can vary substantially, e.g., from about 5 μm (RDL) to about 200 μm (megapillars) Some disclosed methods may be particularly useful for electroplating larger features, such as for features with widths from about 100-300 μm. For example, the methods can be used during fabrication of a substrate with a plurality of megapillars having widths on the order of about 200 μm. In some embodiments the features have an average width of at least about 10 to about 100 μm. The aspect ratios of features can vary, and in some embodiments are from about 1:2 (height to width) to 2:1, from about 1:2 to 10:1, and greater. Some disclosed methods are particularly useful for high aspect ratio features, e.g., about 4:1 and greater. In addition, provided methods are useful for substrates containing features of different sizes. For example, the substrate may contain a first feature having a first width and a feature having a second width that is at least about 1.2 times, such as at least 1.5 times, or at least 2 times greater than the second widths. Substrates having isolated features and/or features having different widths benefit substantially from the disclosed methods, given the variability in metal thickness distribution of such substrates.

In contrast to the conventional wafer manufacturing process described above of slicing the water into individual circuits (referred to as "dice") and then packaging them, WLP involves packaging of an IC while it is still part of the wafer. Maintenance of tight uniformity regarding WID, WIW and WIF of pillars, e.g. formed of metal, is often highly desirable in WLP applications, for example maintaining a target uniformity of less than about 1 μm coplanarity.

Conclusion

In the prior description, numerous specific details are set forth to provide a thorough understanding of the presented embodiments. Embodiments disclosed herein may be practiced without some or all of these specific details. In other instances, well-known process operations have not been described in detail to not unnecessarily obscure the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of electroplating a metal into features of a substrate comprising a partially fabricated electronic device with features in a layer of photoresist over a metal seed layer, wherein the sidewalls of the features in the layer of photoresist are non-conductive, the method comprising:
   (a) exposing a surface of a substrate to a pre-acceleration solution comprising an accelerator compound;
   (b) immersing at least the surface of the substrate in an electroplating solution comprising ions of the metal, a suppressor, and a leveler of a type that reduces a plating rate of more exposed regions of the substrate surface relative to more recessed regions of the substrate surface;
   (c) while the surface of the substrate is immersed in the electroplating solution, electroplating the metal into the features to partially fill the features; and
   (d) removing the substrate from the electroplating solution, wherein the features in the layer of photoresist have different depths, different loadings, different shapes, and/or different critical dimensions when viewed top down toward the substrate, and combinations thereof, wherein metal pillars are formed during (c) having top surfaces that deviate from coplanarity by less than bottom surfaces of the features prior to the electroplating in (c).

2. The method of claim 1, wherein the surface of the substrate in (a) becomes saturated with accelerator compound.

3. The method of claim 1, wherein the leveler reduces the plating rate of more exposed regions of the substrate surface relative to more recessed regions of the substrate surface by polarizing deposition at the more exposed regions of the substrate surface relative to more recessed regions of the substrate surface or by reducing the depolarization effect of the accelerator compound at the more exposed regions of the substrate surface relative to more recessed regions of the substrate surface.

4. The method of claim 1, wherein the leveler is characterized by producing an electrochemical response in the following test:
   (i) contacting a test solution having an known concentration of the leveler with a metal surface of a test electrode substantially saturated with the an accelerator compound;
   (ii) measuring the electrochemical response while plating the test electrode in the test solution having the known concentration of the leveler; and
   (iii) determining that the electrochemical response has at least a threshold magnitude.

5. The method of claim 4, wherein the test solution has a known concentration of leveler between about 0.1 and about 50 ppm.

6. The method of claim 4, wherein the test solution has a known concentration of leveler between about 1 and about 25 ppm.

7. The method of claim 4, wherein the test electrode is a rotating disk electrode.

8. The method of claim 1, wherein the metal is copper.

9. The method of claim 1, wherein the pre-acceleration solution comprises 0.05 to 10 g/L accelerator compound in deionized water or weak acid.

10. The method of claim 1, wherein the accelerator compound is a mercapto sulphonic acid compound or a dimercapto sulphonic acid compound.

11. The method of claim 1, wherein the accelerator compound is selected from the group consisting of mercaptopropane sulfonic acid, dimercaptopropane sulfonic acid, mercaptoethane sulfonic acid, dimercaptoethane sulfonic acid, and bis-(3-sulfopropyl)-disulfide.

12. The method of claim 1, wherein the electroplating solution comprises no accelerator or accelerator at a concentration of less than about 1 ppm.

13. The method of claim 1, wherein the leveler in the electroplating solution is selected from the group consisting of polyethylenimines, polyamidoamines, dialkylamines, trialkylamines, arylalkylamines, triazoles, imidazoles, tetrazoles, benzimidazoles, benzotriazoles, piperidine, morpholine, piperazine, pyridine, oxazole, benzoxazole, pyrimidine, quonoline, isoquinoline, and epihalohydrins.

14. The method of claim 1, wherein the suppressor in the electroplating solution is selected from the group consisting of polyethylene glycols, polyethylene oxides, polypropylene glycols, and polypropylene oxides.

15. The method of claim 1, wherein exposing the surface of a substrate to the pre-acceleration solution comprising an accelerator compound is performed in a first chamber and wherein electroplating the metal into the features to partially fill the features is performed in a second chamber.

16. The method of claim 15, wherein the first chamber is operated at sub-atmospheric pressure while exposing the surface of a substrate to the pre-acceleration solution comprising an accelerator compound.

17. The method of claim 1, wherein pillars are formed during the electroplating (c) having less non-uniformity than the features in the layer of photoresist prior to the electroplating in (c).

18. The method of claim 1, further comprising:
   stopping electroplating metal in (c) before the features in the layer of photoresist are fully filled;
   immersing at least the surface of the substrate in a second electroplating solution comprising ions of the metal, and an additive composition that is different from that in the electroplating solution used in (b) and (c); and electroplating more of the metal into the features in the layer of photoresist, to further fill the features, while contacting the features with a second electroplating solution.

19. The method of claim 18, wherein second electroplating solution comprises a greater concentration of leveler and accelerator than are present in the electroplating solution used in (b) and (c).

20. The method of claim 1, further comprising:
    stopping electroplating the metal in (c) before the features in the layer of photoresist are fully filled;
    again exposing the surface of a substrate to the pre-acceleration solution and allowing the surface of the substrate, as partially electroplating with the metal, to become substantially saturated with the accelerator compound; and
    electroplating additional metal in the features in the layer of photoresist using a second electroplating solution.

21. The method of claim 1, wherein the electroplating in (c) produces metal pillars that are a component of wafer level packaging.

22. The method of claim 21, further comprising forming a contact between the metal pillars and a tin silver composition.

23. The method of claim 1, wherein the features in the layer of photoresist on the substrate are holes, and wherein electroplating the metal in operation (c) forms metal pillars in the holes.

24. The method of claim 23, wherein the bases of the holes comprise a conductive seed layer.

25. The method of claim 1, wherein the features in the layer of photoresist have an average depth of at least about 20 to 70 μm.

26. The method of claim 1, wherein the features in the layer of photoresist have an average depth of at least about 5 μm.

27. The method of claim 1, wherein the features in the layer of photoresist have an average depth of at most about 270 μm.

28. The method of claim 1, wherein the features in the layer of photoresist have an average width of at least about 10 to 100 μm.

29. The method of claim 1, wherein the features in the layer of photoresist have a difference in depth between deepest and shallowest features of at least about 5 microns.

30. The method of claim 1, wherein the shallowest feature in the layer of photoresist is at least about 5% shorter than the deepest feature in the layer of photoresist.

31. The method of claim 1, wherein the shallowest feature in the layer of photoresist is at least about 10% shorter than the deepest feature in the layer of photoresist.

32. The method of claim 1, wherein at least some of the features in the layer of photoresist have an aspect ratio of between about 1:2 and 10:1.

33. The method of claim 1, wherein during electroplating in (c), the deepest feature has a mass transfer boundary layer in the electroplating solution having a thickness of less than about 50 micrometers.

34. The method of claim 1, wherein during electroplating in (c), fluid velocity near the substrate surface is between about 0.1 and 1.0 m/s and the fluid flow is at least partially laminar.

35. The method of claim 1, wherein during electroplating in (c), leveler diffuses into shallow features faster than deep features, reducing the electroplating rate in shallow features compared to deep features.

36. The method of claim 35, wherein at least one of the deep features is at least 5% deeper than at least one of the shallow features.

* * * * *